United States Patent
Suematsu et al.

(10) Patent No.: US 10,360,982 B2
(45) Date of Patent: Jul. 23, 2019

(54) SEMICONDUCTOR MEMORY DEVICE

(71) Applicant: TOSHIBA MEMORY CORPORATION, Minato-ku, Tokyo (JP)

(72) Inventors: Yasuhiro Suematsu, Yokohama Kanagawa (JP); Masaru Koyanagi, Tokyo (JP); Satoshi Inoue, Zushi Kanagawa (JP); Kenro Kubota, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/702,216

(22) Filed: Sep. 12, 2017

(65) Prior Publication Data
US 2018/0277219 A1 Sep. 27, 2018

(30) Foreign Application Priority Data
Mar. 21, 2017 (JP) ................. 2017-054881

(51) Int. Cl.
| | |
|---|---|
| *G11C 16/06* | (2006.01) |
| *G11C 16/08* | (2006.01) |
| *H01L 27/11526* | (2017.01) |
| *H01L 27/11573* | (2017.01) |
| *G11C 16/24* | (2006.01) |
| *H01L 23/528* | (2006.01) |

(Continued)

(52) U.S. Cl.
CPC ............ *G11C 16/08* (2013.01); *G11C 7/1069* (2013.01); *G11C 7/1096* (2013.01); *G11C 16/24* (2013.01); *G11C 16/26* (2013.01); *H01L 23/528* (2013.01); *H01L 27/11526* (2013.01); *H01L 27/11573* (2013.01); *G11C 16/0483* (2013.01); *G11C 16/30* (2013.01); *G11C 2207/105* (2013.01); *H01L 27/0207* (2013.01); *H01L 27/092* (2013.01)

(58) Field of Classification Search
CPC ..... G11C 16/08; G11C 16/24; G11C 16/0483; G11C 16/30; G11C 7/1096; G11C 16/26; H01L 23/528; H01L 27/11526; H01L 27/11573
USPC .................................................... 365/185.23
See application file for complete search history.

(56) References Cited

U.S. PATENT DOCUMENTS

2007/0008801 A1* 1/2007 Chiang ............... G11C 5/14
365/226
2008/0197883 A1  8/2008 Onishi
(Continued)

FOREIGN PATENT DOCUMENTS

| JP | 2008206307 A | 9/2008 |
| JP | 2012235048 A | 11/2012 |
| JP | 2016051723 A | 4/2016 |

*Primary Examiner* — Huan Hoang
(74) *Attorney, Agent, or Firm* — Holtz, Holtz & Volek PC

(57) ABSTRACT

The present embodiment discloses a semiconductor memory device which includes a memory cell array, a signal pad, a first voltage pad, a first regulation circuit and a first operation circuit. The signal pad supplies an output signal associated with the memory cell array. The first voltage pad receives a first voltage. The first regulation circuit regulates a signal output from the signal pad. The first operation circuit operates the first regulation circuit. The first regulation circuit and the first operation circuit are provided between the signal pad and the first voltage pad.

18 Claims, 27 Drawing Sheets

(51) Int. Cl.
  *G11C 7/10*   (2006.01)
  *G11C 16/26*  (2006.01)
  *H01L 27/02*  (2006.01)
  *H01L 27/092* (2006.01)
  *G11C 16/04*  (2006.01)
  *G11C 16/30*  (2006.01)

(56) References Cited

U.S. PATENT DOCUMENTS

2009/0267128 A1   10/2009   Maejima
2009/0268522 A1   10/2009   Maejima
2010/0207195 A1    8/2010   Fukuzumi et al.
2011/0284946 A1   11/2011   Kiyotoshi
2016/0065208 A1    3/2016   Moriya

* cited by examiner

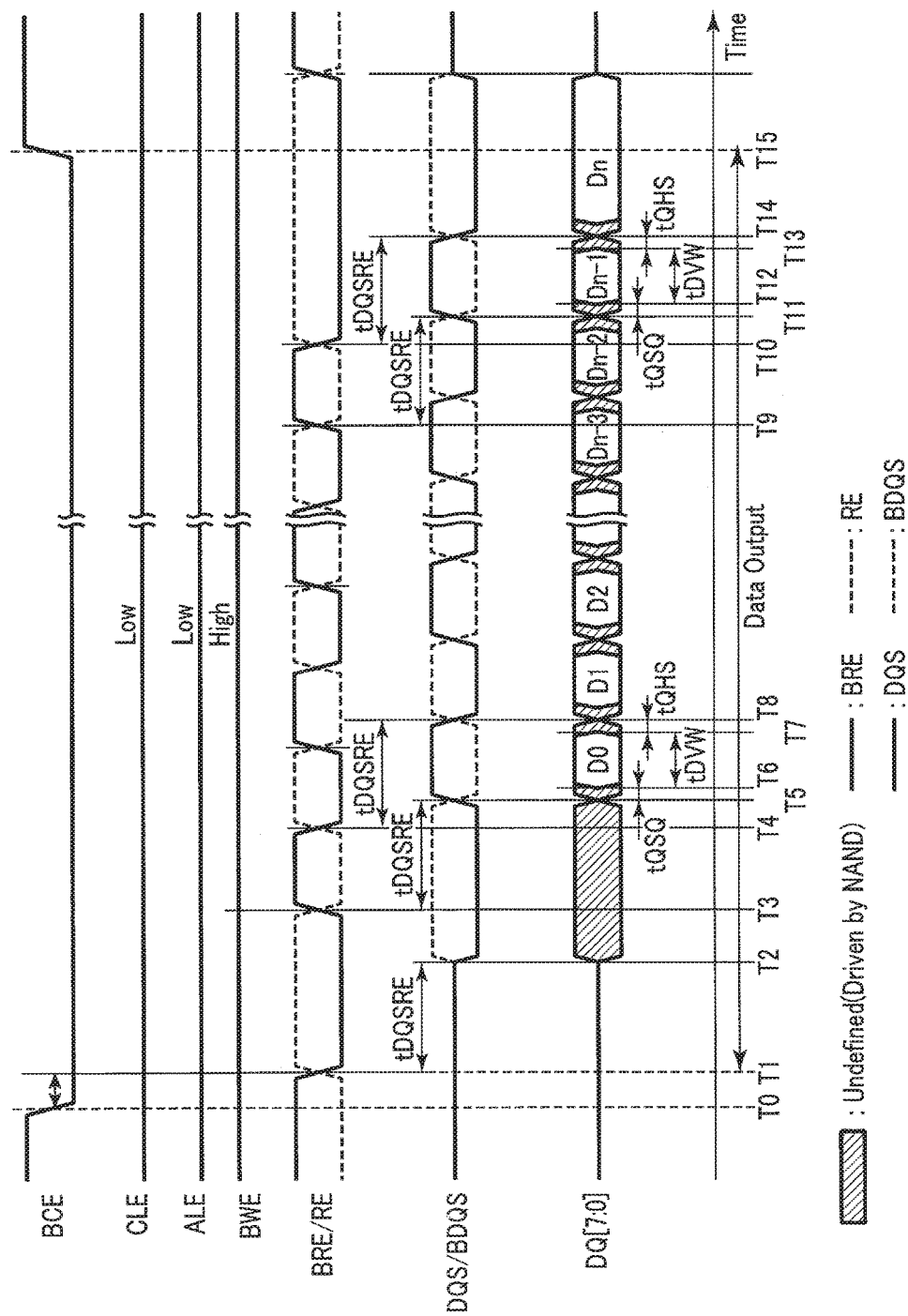
F I G. 3

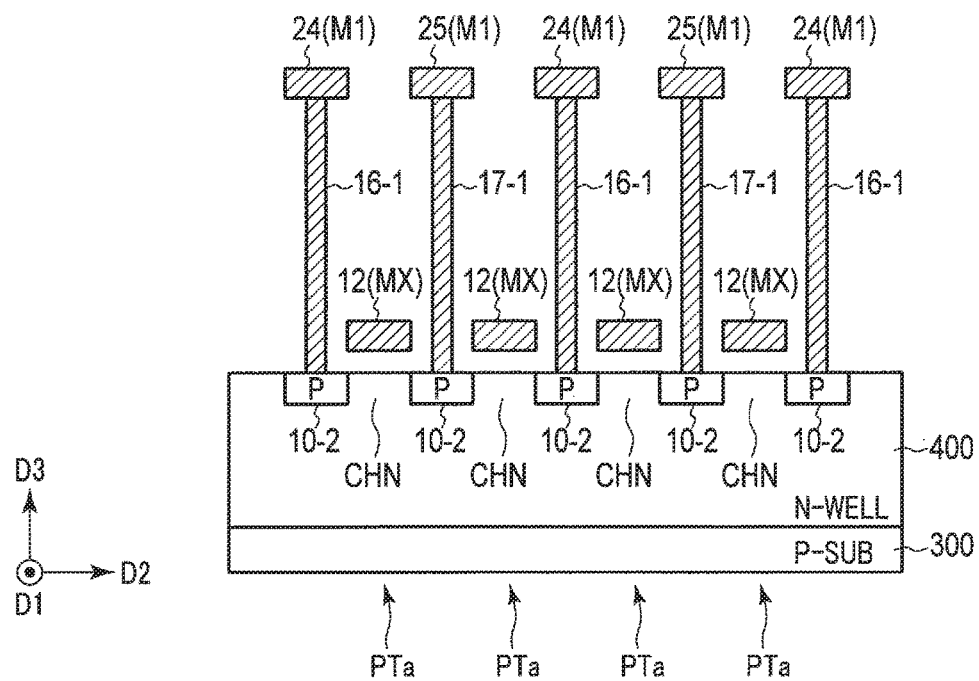
F I G. 10
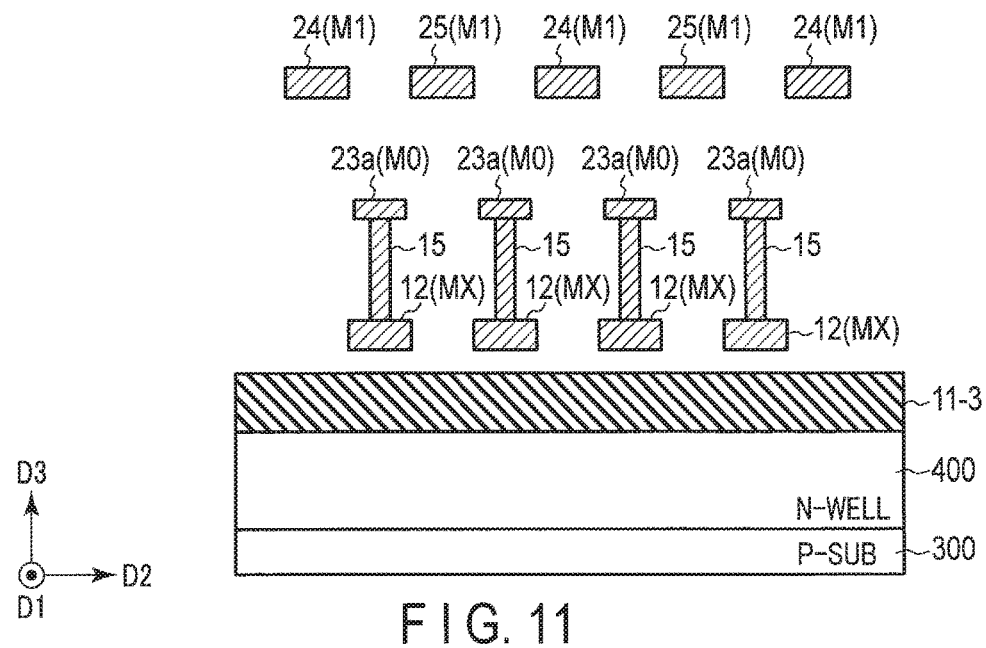
F I G. 11

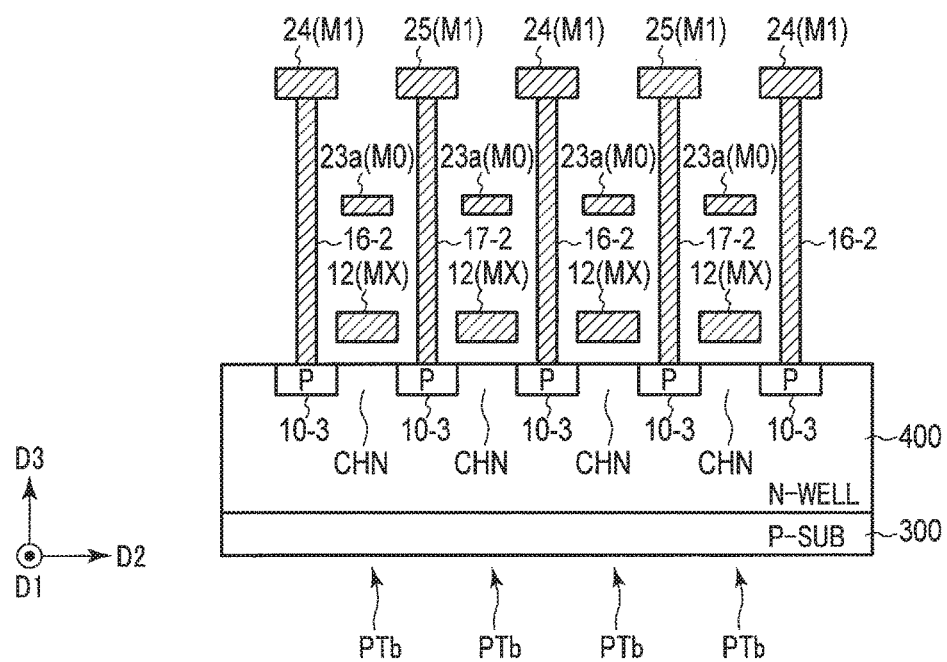
F I G. 12
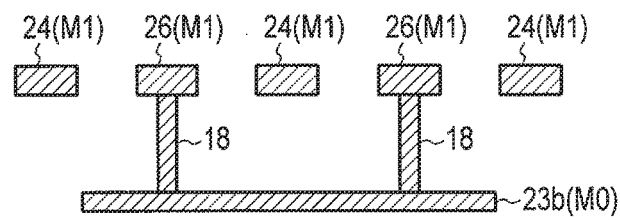
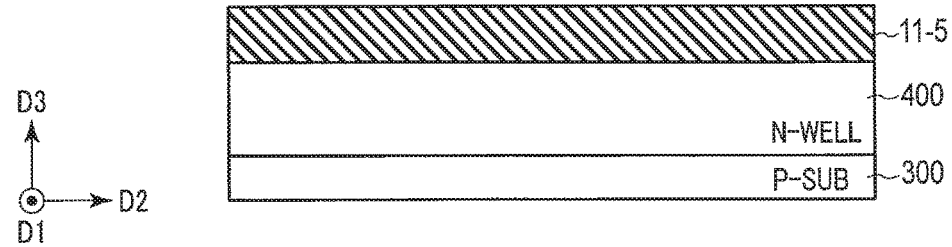
F I G. 13

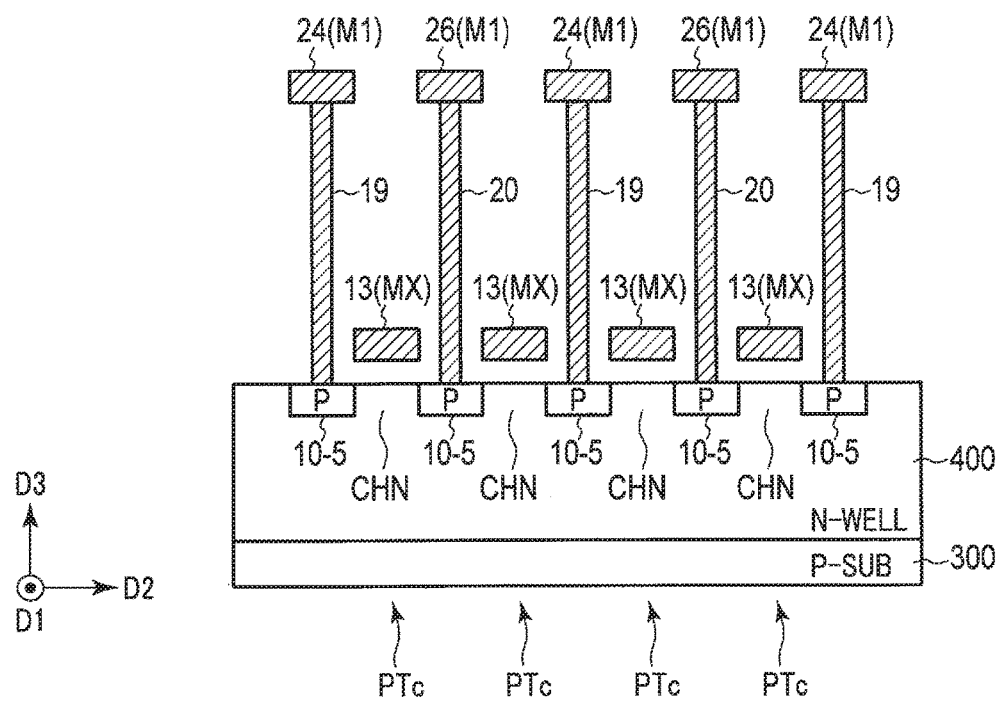
F I G. 14
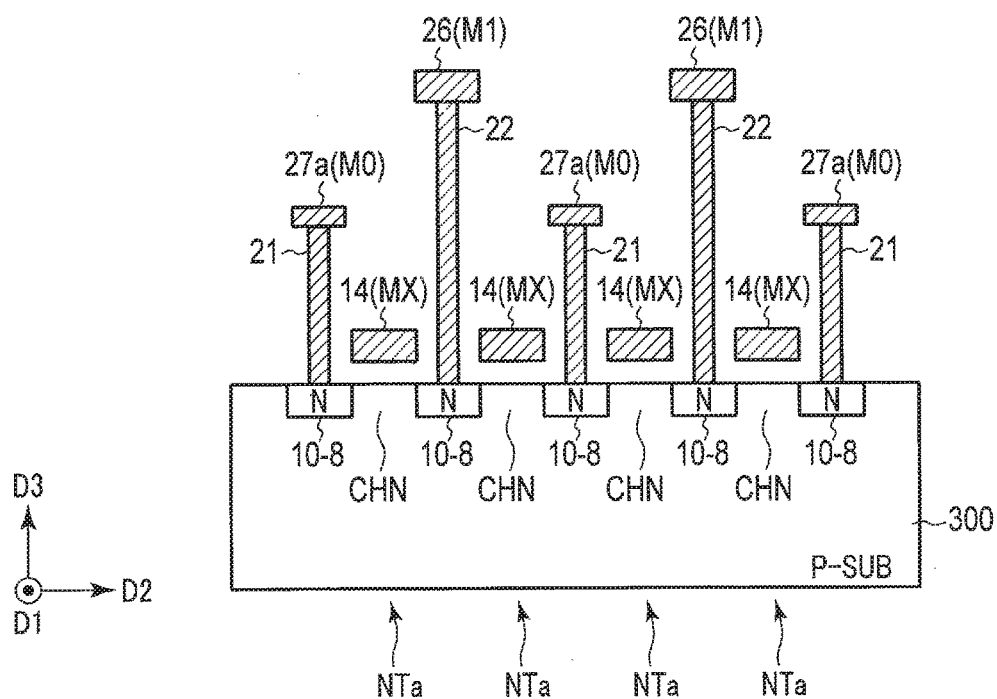
F I G. 15

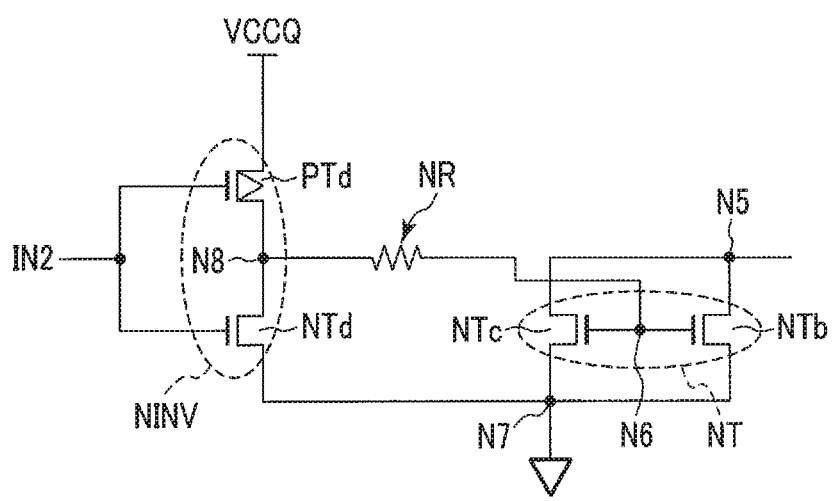
F I G. 17

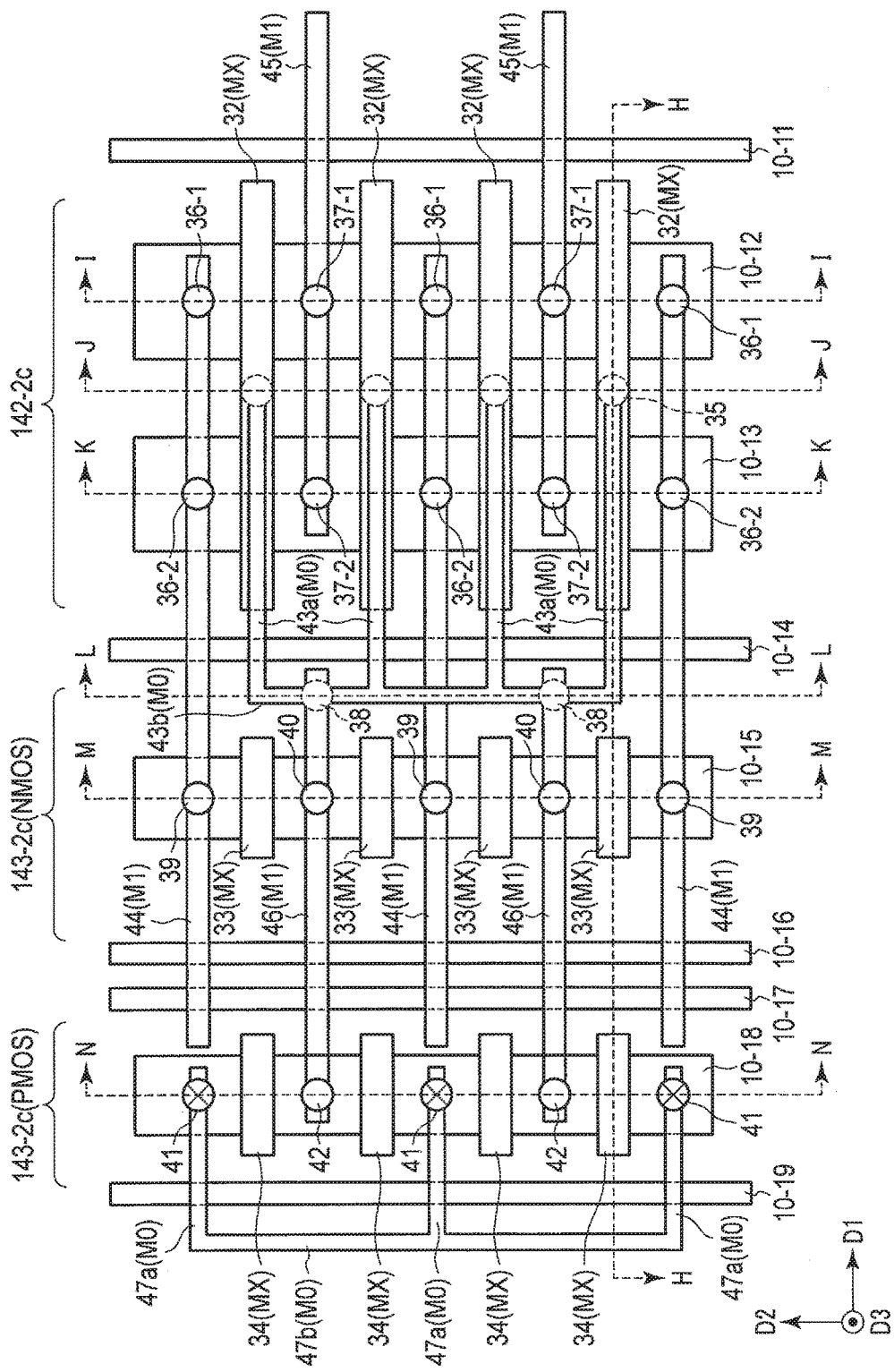
F I G. 18

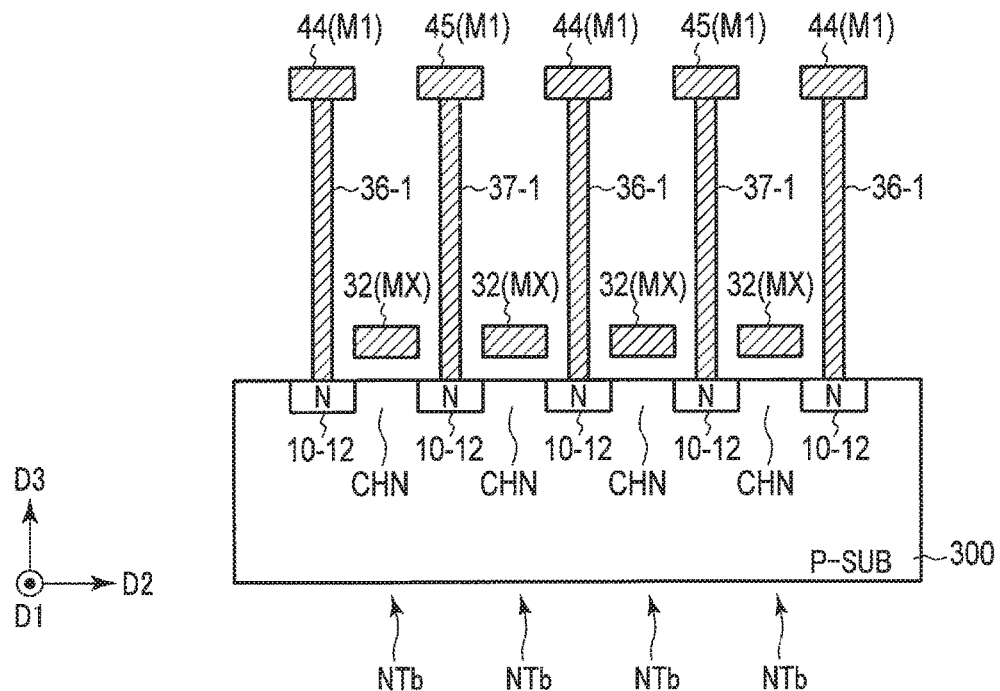
F I G. 20
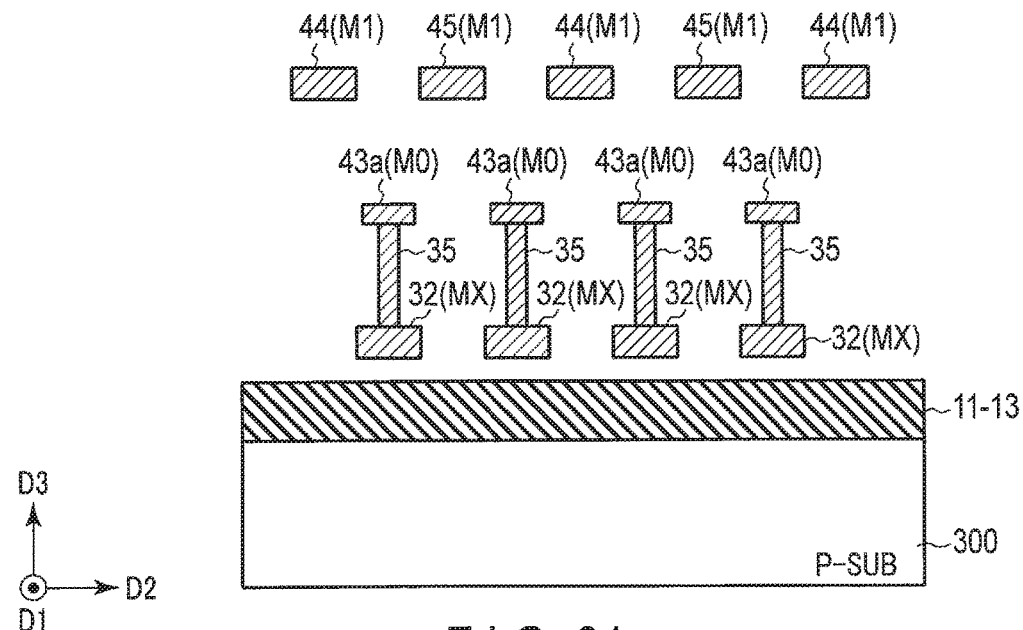
F I G. 21

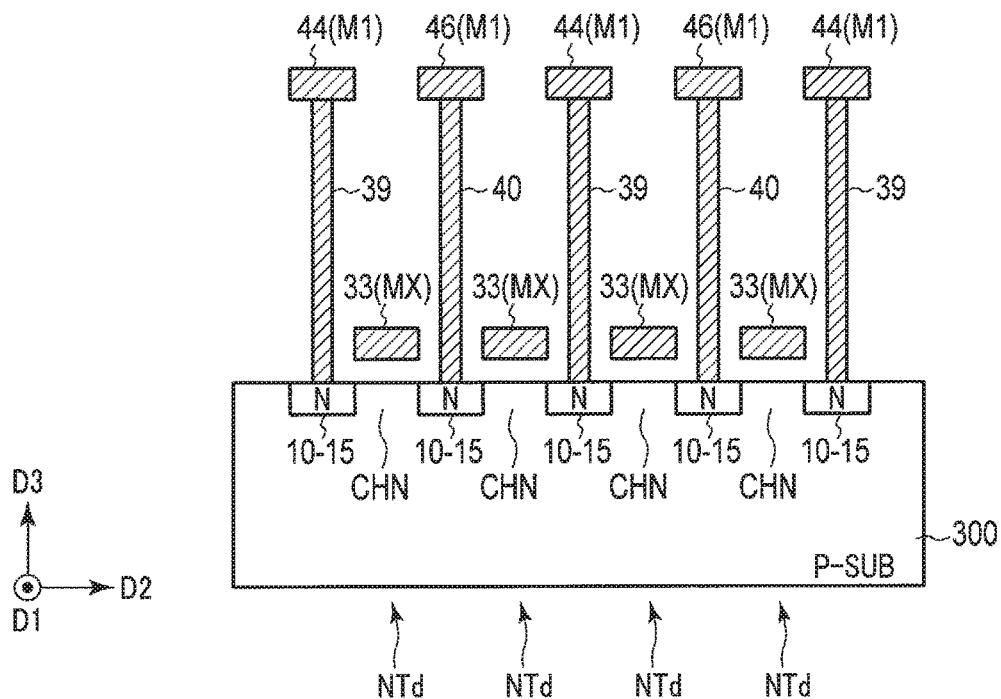
F I G. 24
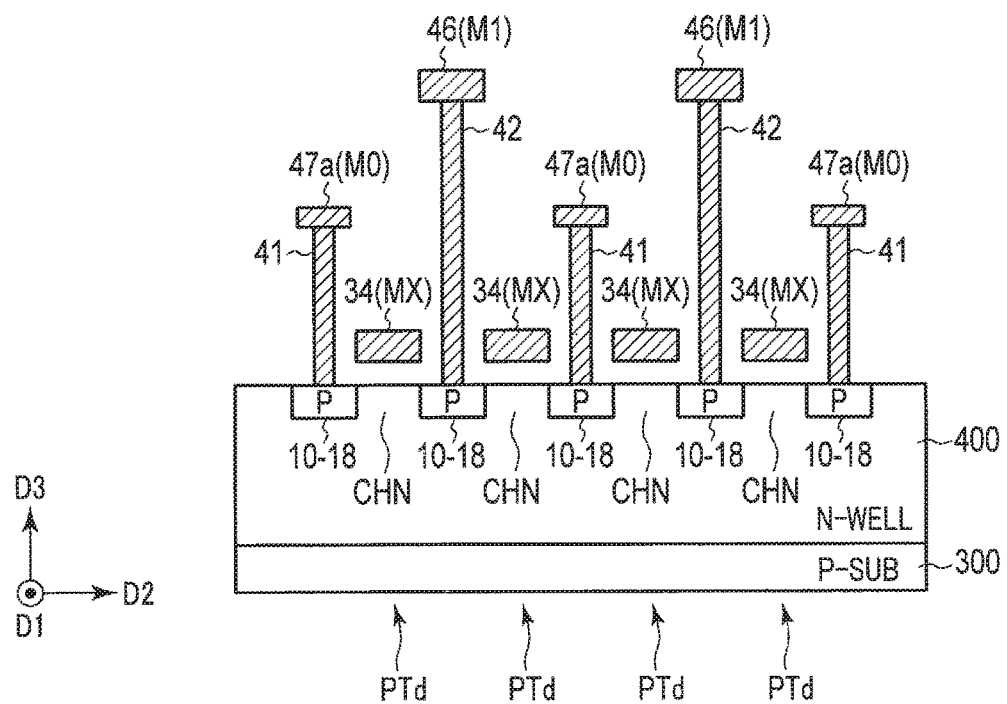
F I G. 25

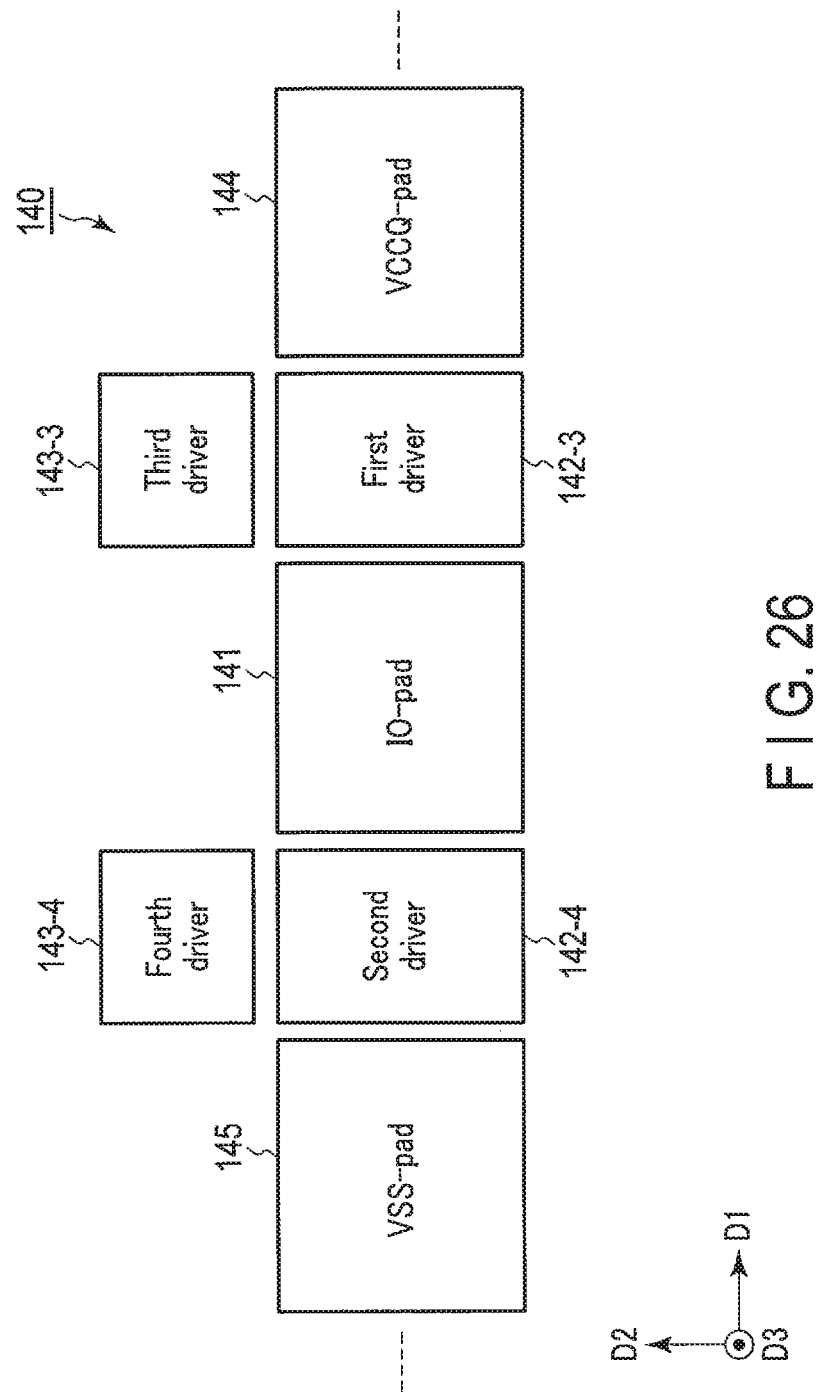
F I G. 26

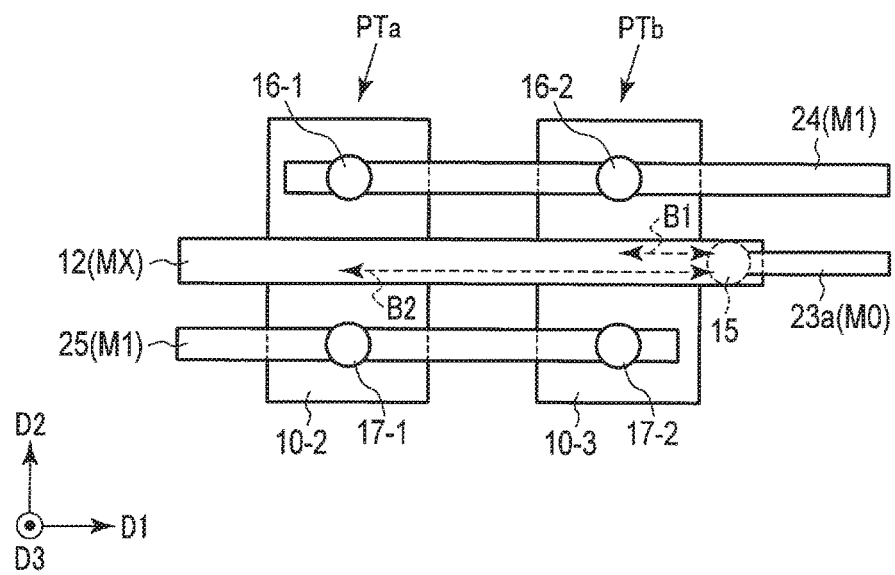
F I G. 31
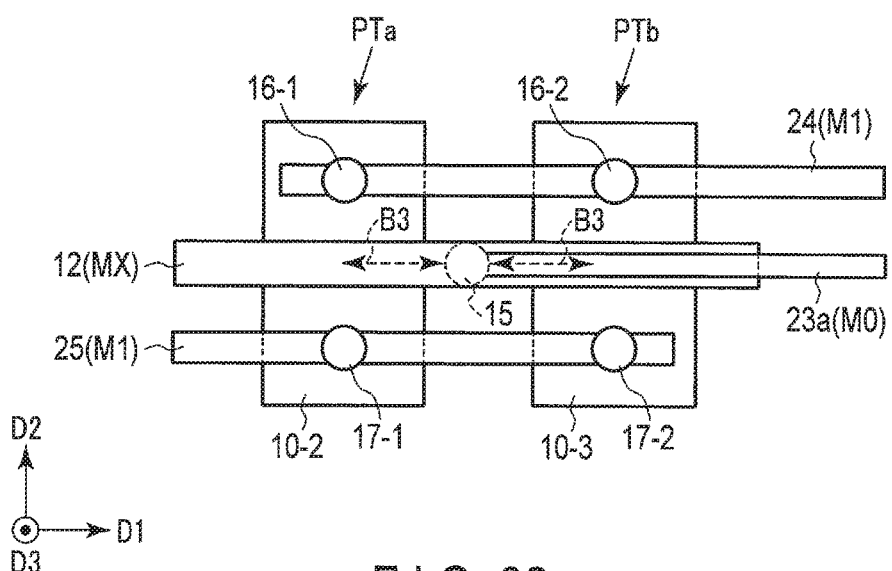
F I G. 32

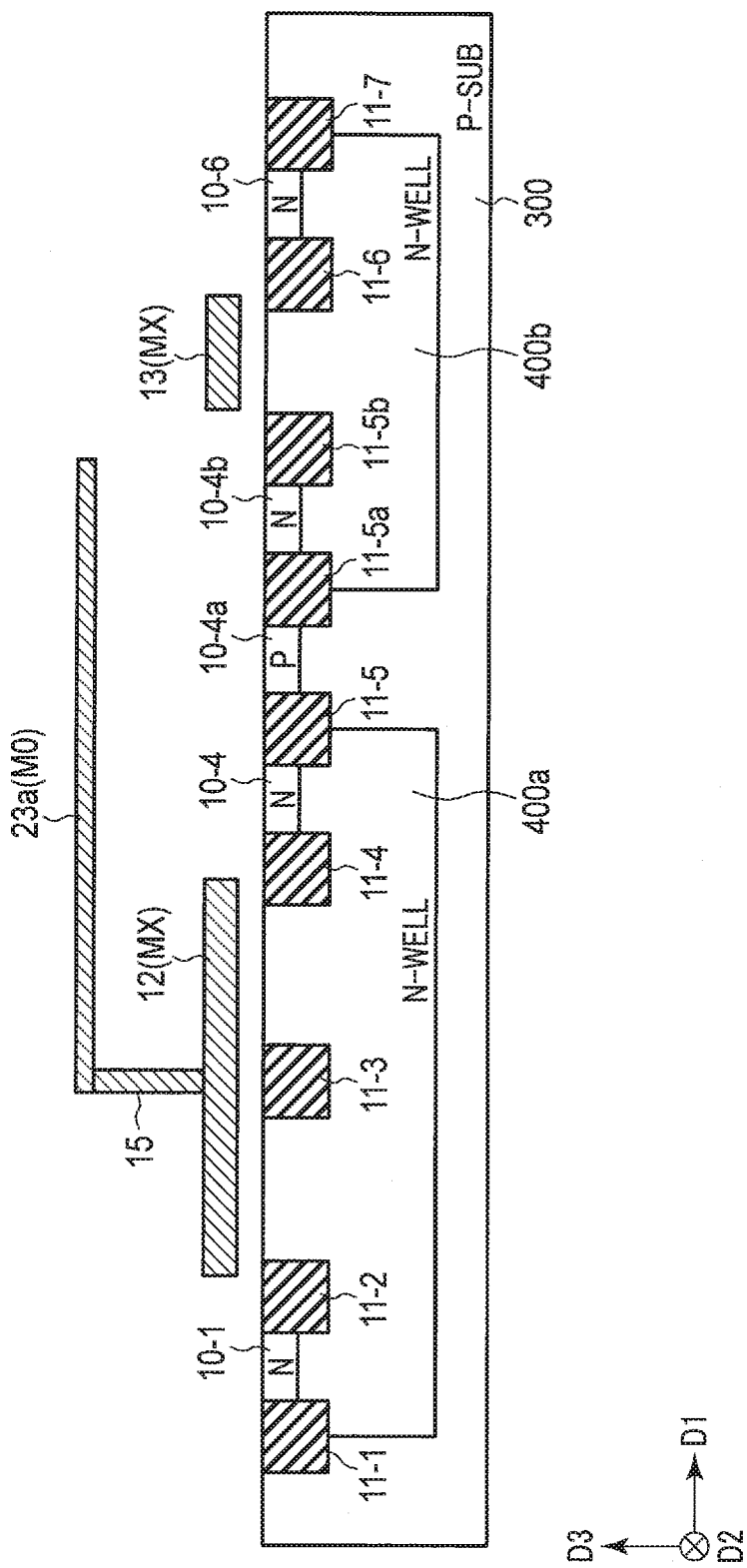
F I G. 34

SEMICONDUCTOR MEMORY DEVICE

CROSS-REFERENCE TO RELATED APPLICATIONS

This application is based upon and claims the benefit of priority from prior Japanese Patent. Application No. 2017-054881, filed Mar. 21, 2017, the entire contents of which are incorporated herein by reference.

FIELD

Embodiments described herein relate generally to a semiconductor memory device.

BACKGROUND

Advances in microfabrication of semiconductor devices are being made.

BRIEF DESCRIPTION OF THE DRAWINGS

FIG. 3 is a chart illustrating basic data output operations performed by a semiconductor memory device according to an embodiment.

FIG. 10 is a sectional view taken in the direction along line B-B in FIG. 8.

FIG. 11 is a sectional view taken in the direction along line C-C in FIG. 8.

FIG. 12 is a sectional view taken in the direction along line D-D in FIG. 8.

FIG. 13 is a sectional view taken in the direction along line E-E in FIG. 8.

FIG. 14 is a sectional view taken in the direction along line F-F in FIG. 8.

FIG. 15 is a sectional view taken in the direction along line G-G in FIG. 8.

FIG. 17 is a circuit diagram illustrating part of the second and fourth drivers of a semiconductor memory device according to an embodiment.

FIG. 18 is a diagram illustrating the layout of part of the second and fourth drivers in a semiconductor memory device according to an embodiment.

FIG. 20 is a sectional view taken in the direction along line I-I in FIG. 18.

FIG. 21 is a sectional view taken in the direction along line J-J in FIG. 18.

FIG. 24 is a sectional view taken in the direction along line M-M in FIG. 18.

FIG. 25 is a sectional view taken in the direction along line N-N in FIG. 18.

FIG. 26 is a diagram illustrating the layout of part of the input/output terminal in a semiconductor memory device according to a comparative example of an embodiment.

FIG. 31 is a diagram illustrating the layout of a PMOS transistor PTb and a contact 15 in a semiconductor memory device according to a comparative example of an embodiment.

FIG. 32 is a diagram illustrating the layout of a PMOS transistor PTb and a contact 15 in a semiconductor memory device according to an embodiment.

FIG. 34 is a sectional view taken in the direction along line O-O in FIG. 33.

DETAILED DESCRIPTION

Figure 1:
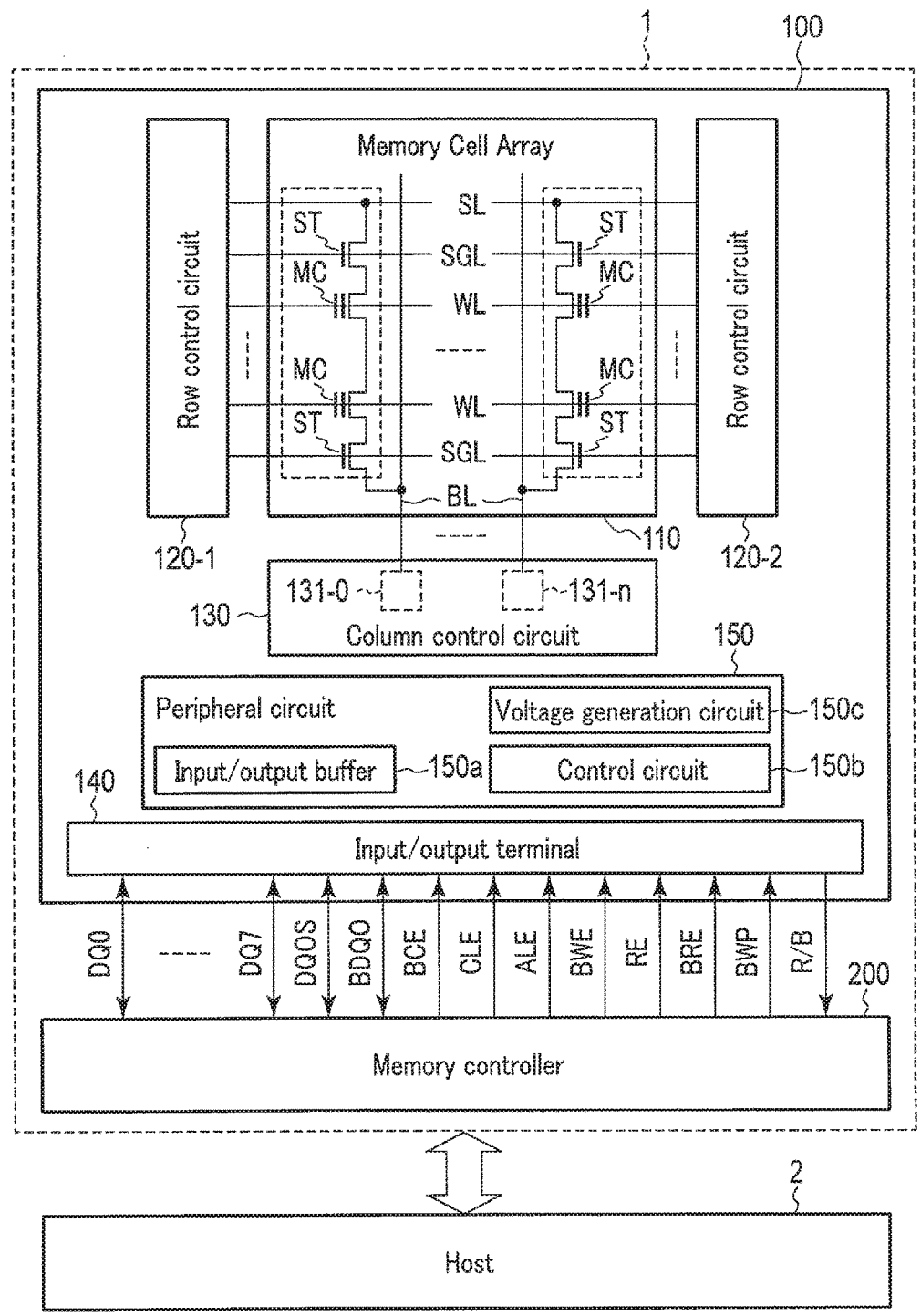
FIG. 1 is a block diagram illustrating a semiconductor memory device according to an embodiment.
Figure 1:
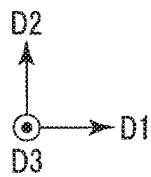

In general, according to one embodiment, a semiconductor memory device which includes a memory cell array, a signal pad, a first voltage pad, a first regulation circuit and a first operation circuit. The signal pad supplies an output signal associated with the memory cell array. The first voltage pad receives a first voltage. The first regulation circuit regulates a signal output from the signal pad. The first operation circuit operates the first regulation circuit. The first regulation circuit and the first operation circuit are provided between the signal pad and the first voltage pad.

Hereinafter, the configurations of embodiments will be described with reference to the accompanying drawings. In the description below, elements having the same or like functions and configurations will be denoted by the same reference symbols. In the drawings, a suffix "-X" (X: a given integer) attached to the reference symbol is used to distinguish elements which are denoted by reference symbols including the same numeral and which have a similar configuration. Where elements denoted by a reference symbol including the same numeral need not be distinguished from each other, they will be denoted by reference symbols including only numerals. For example, where elements denoted by reference symbols "100-1" and "100-2" need not be distinguished from each other, they will be collectively referred to by reference symbol "100."

It should be noted that the drawings are schematic and do not exactly show realities, such as actual relationships between thicknesses and plan dimensions and actual ratios among the thicknesses of the layers. Therefore, specific thicknesses and dimensions should be determined in consideration of the descriptions given below. The dimensional relationships and ratios may, of course, be shown differently between the Figures.

In the descriptions herein, the XYZ orthogonal coordinate system will be adopted for the purpose of illustration. In this coordinate system, the two directions which are parallel to the upper surface of a silicon substrate 11 and are perpendicular to each other will be referred to as D1 (x) direction and D2 (Y) direction, and the direction perpendicular to both D1 (X) direction and D2 (Y) direction, namely, the stacking direction of layers, will be referred to as D3 (Z) direction. In the directions herein, the term "height" is intended to mean the dimension in D3 (Z) direction.

1 Embodiment

A semiconductor memory device according to an embodiment will be described. In the description below, reference will be made to a case where a semiconductor memory device is realized as a planar NAND flash memory.

<1-0> Configuration of Memory System

First, the configuration of a memory system according to the present embodiment will be described with reference to FIG. 1.

As shown in FIG. 1, the memory system 1 comprises a NAND flash memory 100 and a memory controller 200. The memory controller 200 and the NAND flash memory 100 may constitute one semiconductor device, for example, by combining them together. Examples of such a semiconductor device are a memory card such as an SD™ card and a solid state drive (SSD)). The memory system 1 may also be configured together with a host 2.

The NAND flash memory 100 includes a plurality of memory cells and stores data in a nonvolatile manner. The memory controller 200 is connected to the NAND flash memory 100 through a NAND bus, and is connected to the host 2 through a host bus. The memory controller 200 controls the NAND flash memory 100 and accesses the NAND flash memory 100 in response to instructions received from the host 2. The host 2 is, for example, a digital camera or a personal computer, and the host bus is, for example, a bus compatible with the SD™ interface.

The NAND bus is a bus through which signals in compliance with the NAND interface specification are exchanged. Examples of the signals are a chip enable signal BCE, a command latch enable signal CLE, an address latch enable signal ALE, a write enable signal BWE, read enable signals RE and BRE, a write protect signal BWP, a data strobe signals DQS and EDQS, a ready/busy signal BRB, and input and output signals DQ.

<1-1> Overall Configuration of NAND Flash Memory

A schematic description will be given of the configuration of the NAND flash memory 100 (semiconductor memory device) of an embodiment with reference to FIG. 1

As shown in FIG. 1, the NAND flash memory 100 includes a memory cell array 110, row control circuits 120-1 and 120-2, a column control circuit 130, input/output terminal 140, and peripheral circuits 150.

The input/output terminal 140 are provided along one side of the NAND flash memory 100 (a side along D1 direction) and in a peripheral region of the NAND flash memory 100. The memory controller 200 and the NAND flash memory 100 are connected to each other by way of the input/output terminal 140.

The input/output terminal 140 supplies data strobe signals DQS and BDQS, and output signals DQ to the memory controller 200 via pads (not shown).

The input/output terminal 140 generates data strobe signals DOS and BDQS (BDQS is a complementary signal of DQS) in accordance with a signal supplied from the peripheral circuits 150. The input/output terminal 140 outputs data strobe signals DQS and BDQS when data is output from data input/output lines DQ0 to DQ7. In synchronism with the timing of data strobe signals DQS and BDQS, the memory controller 200 receives data from the data input/output lines DQ0 to DQ7.

The input/output terminal 140 receives a chip enable signal BCE, a command latch enable signal CLE, an address latch enable signal ALE, a write enable signal BWE, read enable signals RE and BRE, a write protect signal BWP, and data strobe signals DQS and BDQS from the memory controller 200 via pads (not shown).

The chip enable signal BCE is used as a selection signal for the NAND flash memory 100.

The command latch enable signal CLE is a signal used for supplying operation commands to the peripheral circuits 150.

The address latch enable signal ALE is a signal used for causing the peripheral circuits 150 to acquire address information or input data.

The write enable signal BWE is a signal used for causing the NAND flash memory 100 to acquire the command, address, and data supplied on the input/output terminal 140.

Read enable signal RE is a signal used for causing data to be output from the input/output terminal 140 in a serial manner. The read enable signal BRE is a complementary signal of RE.

The write protect signal BWP is used for protecting data from unexpected erasure or write, where an input signal is not assured when the NAND flash memory 100 is turned on or off.

The input/output signal DQ is an 8-bit signal, for example. The input/output signal DQ represents a substantial data exchanged between the NAND flash memory 100 and the memory controller 200, and the input/output signal DQ may be a command, an address, a write data, and a read data.

The input/output terminal 140 supplies the ready/busy signal BRB to the memory controller 200.

The ready/busy signal BRB is a signal indicative of whether the NAND flash memory 100 is in a ready state (i.e., a state where an instruction supplied from the memory controller 200 can be received) or in a busy state (i.e., a state where an instruction supplied from the memory controller 200 cannot be received). The ready/busy signal BRB indicates the busy state when it is at the "L" level.

Although not shown in FIG. 1, Vcc, Vss, Vccq, Vssq terminals, etc. for power supply are provided in the input/output terminal 140.

The memory cell array 110 includes a plurality of bit lines BL, a plurality of word lines WL and a source line SL. The memory cell array 110 is formed into a plurality of blocks BLK, in each of which electrically-rewritable memory cell transistors (also referred to simply as memory cells) MC are arranged in a matrix pattern. Each memory cell transistor MC comprises, for example, a stacked gate including a control gate electrode and a charge storage layer (e.g., a floating gate electrode), and stores binary or multivalued data utilizing change in a transistor threshold caused by the amount of charge injected into the floating gate electrode. The memory cell transistor MC may have a metal-oxide-nitride-oxide-silicon (MONOS) configuration which traps electrons in a nitride film.

A configuration of the memory cell array 110 is described, for example, in U.S. patent application Ser. No. 12/397,711 filed on Mar. 3, 2009 and entitled "SEMICONDUCTOR MEMORY DEVICE HAVING PLURALITY OF TYPES OF MEMORIES INTEGRATED ON ONE CHIP." A configuration of the memory cell array 110 is also described in U.S. patent application Ser. No. 13/451,185 filed on Apr. 19, 2012 and entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE", U.S. patent application Ser. No. 12/405,626 filed on Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and U.S. patent application Ser. No. 09/956,986 filed on Sep. 21, 2001 and entitled. "NONVOLATILE SEMICONDUCTOR MEMORY DEVICE HAVING ELEMENT ISOLATING REGION OF TRENCH TYPE AND METHOD OF MANUFACTURING THE SAME." The entire contents of these applications are incorporated herein by reference.

When data is read, written, or erased, the row control circuits 120-1 and 120-2 select one of blocks BLK and make the remaining blocks BLK in an unselected state. The row control circuits 120-1 and 120-2 apply an appropriate voltage required for the read, write, or erase operation to the word lines WL and selection gate lines SGL of the memory cell array 110. Where the row control circuits 120-1 and 120-2 need not be distinguished from each other, they will be referred to simply as row control circuits 120.

The column control circuit 130 may include: sense amplifiers (sense circuits) 131-0 to 131-$n$ ($n$: a natural number) for sensing and amplifying voltages on the bit lines BL in the memory cell array 110; and data storage circuits (not shown) for latching read data or write data; etc. Where sense amplifiers 131-0 to 131-$n$ need not be distinguished from one another, they will be referred to simply as sense amplifiers 131. The column control circuit 130 senses data in the memory cell transistors MC of the memory cell array 110 by means of the bit lines BL.

The peripheral circuits 150 include an input/output buffer 150$a$, a control circuit 150$b$, and a voltage generation circuit 150$c$.

The input/output buffer 150$a$ permits data in the memory cell transistors MC, which is read by the column control circuit 130 and stored in the data storage circuits, to be supplied from the input/output terminal 140 to an external device (the memory controller 200 or host 2).

The control circuit 150$b$ controls the memory cell array 110, the row control circuit 120, the column control circuit 130, the input/output terminal 140, the input/output buffer 150$a$, and the voltage generation circuit 150$c$. The control circuit 150$b$ boosts a power supply voltage by means of the voltage generation circuit 150$c$, as needed, and applies the boosted voltage to the row control circuit 120, the column control circuit 130, and the input/output buffer 150$a$.

The control circuit 150$b$ controls the NAND flash memory 100 in accordance with a control signal and a command which are supplied from the input/output terminal 140.

When data is programmed, verified, read, and erased, the voltage generation circuit 150$c$ generates various voltages in response to instructions from the control circuit 150$b$.

<1-2> Schema of Input/Output Terminal

A schema of the input/output terminal 140 will be described with reference to FIG. 2.

Figure 2:
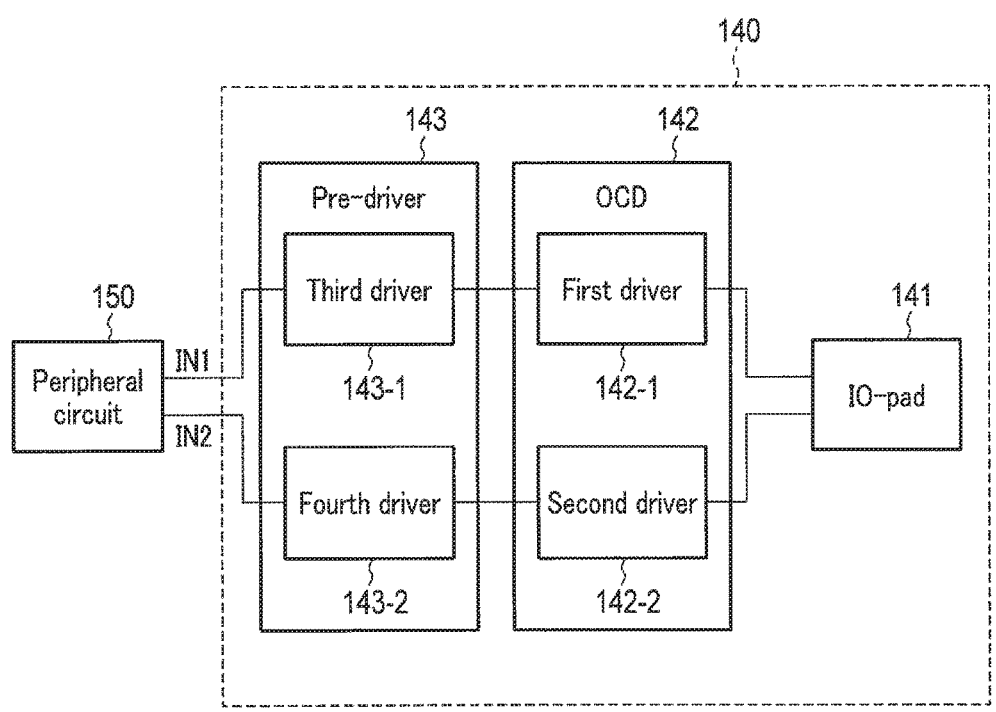
FIG. 2 is block diagram schematically illustrating the input/output terminal of a semiconductor memory device according to an embodiment.

As shown in FIG. 2, the input/output terminal 140 includes, for example, an IO pad 141, an off-chip driver (OCD) 142, and a pre-driver 143.

The pre-driver 143 includes a third driver 143-1 and a fourth driver 143-2. The third driver 143-1 generates an output signal, based on a signal IN1 supplied from the peripheral circuits 150 (e.g., the control circuit 150$b$). The fourth driver 143-2 generates an output signal, based on a signal IN2 supplied from the peripheral circuits 150 (e.g., the control circuit 150$b$). Details of the third driver 143-1 and the fourth driver 143-2 will be described later.

The off-chip driver 142 includes a first driver 142-1 and a second driver 142-2. The first driver 142-1 operates based on a signal received from the third driver 143-1. The second driver 142-2 operates based on a signal received from the fourth driver 143-2. Details of the first driver 142-1 and the second driver 142-2 will be described later.

The IO pad 141 supplies signals generated by the first driver 142-1 and the second driver 142-2 to the memory controller 200.

<1-2-1> Basic Operation for Data Output

A basic operation for a data output in the NAND flash memory 100 of an embodiment will be described with reference to FIG. 3.

[Time T0]

At time T0, the memory controller 200 lowers the chip enable signal BCE from the "H (High)" level to the "L (Low)" level (L<H).

[Time T1]

At time T1, which is a predetermined time period after time T0, the memory controller 200 raises the read enable signal RE from the "L" level to the "H" level and lowers the read enable signal BRE from the "H" level to the "L" level.

[Time T2]

At time T2, which is a tDQSRE time period after T1, the input/output terminal 140 generates the data strobe signals DQS and BDQS based on the read enable signals RE and BRE.

At time T2, the input/output terminal 140 lowers the data strobe signal DQS to the "L" level and raises the data strobe signal BDQS to the "H" level.

[Time T3]

At time T3, the memory controller 200 lowers the read enable signal RE from the "H" level to the "L" level and raises the read enable signal BRE from the "L" level to the "H" level.

[Time T4]

At time T4, the memory controller 200 raises the read enable signal RE from the "L" level to the "H" level and lowers the read enable signal BRE from the "H" level to the "L" level.

[Time T5]

In the period between time T3 and time T5, the input/output terminal 140 raises the data strobe signal DQS to the "H" level and lowers the data strobe signal BDQS to the "L" level.

At time T5, which is a tDQSRE time period after time T3, the level of data strobe signal DQS and the level of data strobe signal BDQS intersect each other.

[Time T6]

At time T6, which is a tQSQ time period after time T5, the input/output terminal 140 starts output of data D0.

[Time T7]

In the period form time T6 to time T7, which is a tDVW time period after time T6, the input/output terminal 140 completes the output of data D0.

[Time T8] to [Time T15]

In the period from time T4 to time T8, the input/output terminal 140 lowers the data strobe signal DQS to the "L" level and raises the data strobe signal BDQS to the "H" level.

At time T8, which is a tDQSRE time period after time T4, the level of data strobe signal DQS and the level of data strobe signal BDQS intersect each other.

By repeating the operations performed between time T5 and time T8, the input/output terminal 140 supplies data D1 to Dn (n: a natural number) to the memory controller 200, based on data strobe signals DQS and BDQS.

<1-2-2> Time Period tDVW

As described above, the input/output terminal 140 may supply data to the memory controller 200 within a time period tDVW defined by the data strobe signal DQS and BDQS. The time period tDVW is a period of time when data strobe signals DQS and BDQS are at the "H" level and the "L" level, respectively.

The time required for the waveforms of the data strobe signals DQS and BDQS to rise or fall (the slope of the leading edge or trailing edge) varies depending upon the voltage applied to the NAND flash memory 100, the temperature of the NAND flash memory 100, etc.

Two types of data strobe signal DQS appearing in different conditions will be described with reference to FIG. 4. Since the description of the data strobe signal DQS applies to the data strobe signal BDQS as well, the description of the data strobe signal BDQS will be omitted.

Figure 4:
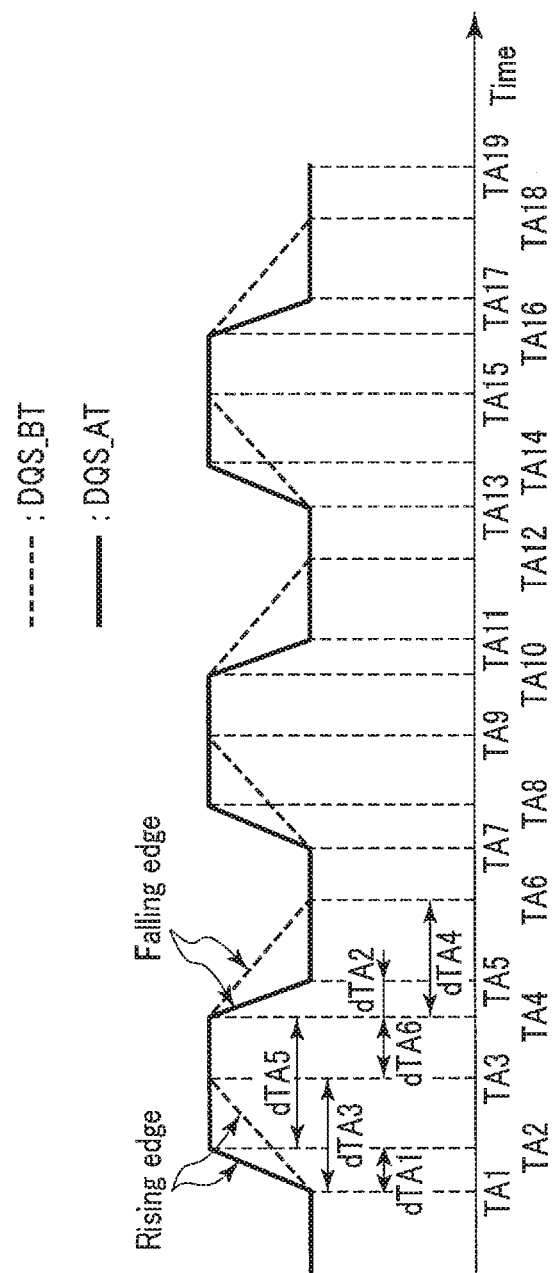
FIG. 4 is a waveform chart illustrating a data strobe line DQS of a semiconductor memory device according to an embodiment.

As shown in FIG. 4, a data strobe signal DQS_AT rises from the "L" level to the "H" level in a period dTA1 between time TA1 and time TA2. The data strobe signal DQS_AT falls from the "H" level to the "L" level in a period dTA2 between time TA4 and time TA5.

A data strobe signal DQS_BT rises from the "L" level to the "H" level in a period dTA3 (dTA3>dTA1) between time TA1 and time TA3. The data strobe signal DQS_BT falls from the "H" level to the "L" level in a period dTA4 (dTA4>dTA2) between time TA4 and time TA6.

The time period tDVW for the data strobe signal DQS_AT is based on a time period dTA5 between time TA2 and time TA4, in which the time period data strobe line DQS_AT is at the "H" level. The time period tDVW for the data strobe signal DQS_BT is based on a time period dTA6 (dTA6<dTA5) between time TA3 and time TA4, in which time period the data strobe signal DQS_BT is at the "H" level.

As such, the longer the time period required for the waveform of the data strobe signal DQS to rise or fall is (the closer to 180° the slope is), the shorter the time period tDVW becomes. For example, if the time period tDVW is too short, a data exchange may not be performed properly between the NAND flash memory 100 and the memory controller 200. In particular, when the NAND flash memory 100 is operated at high speed, the time period tDVW shortens in proportion to the operation speed. Therefore, a proper data exchange may not be performed when the NAND flash memory 100 is operated at high speed. Thus, regulation of the waveform of signals is desired.

The time required for the waveform of the data strobe signal DQS to rise or fall (the slope of the leading edge or trailing edge) varies in accordance with the control signals IN1 and IN2 supplied to the input/output terminal 140.

<1-3> Layout of Input/Output Terminal

<1-3-1> Layout of Part of Input/Output Terminal

A layout of part of the input/output terminal 140 will be described with reference to FIG. 5. The input/output terminal 140 is provided with a plurality of pads for supplying and receiving the signals mentioned above. To simplify the description, however, reference will be made to a single pad.

Figure 5:
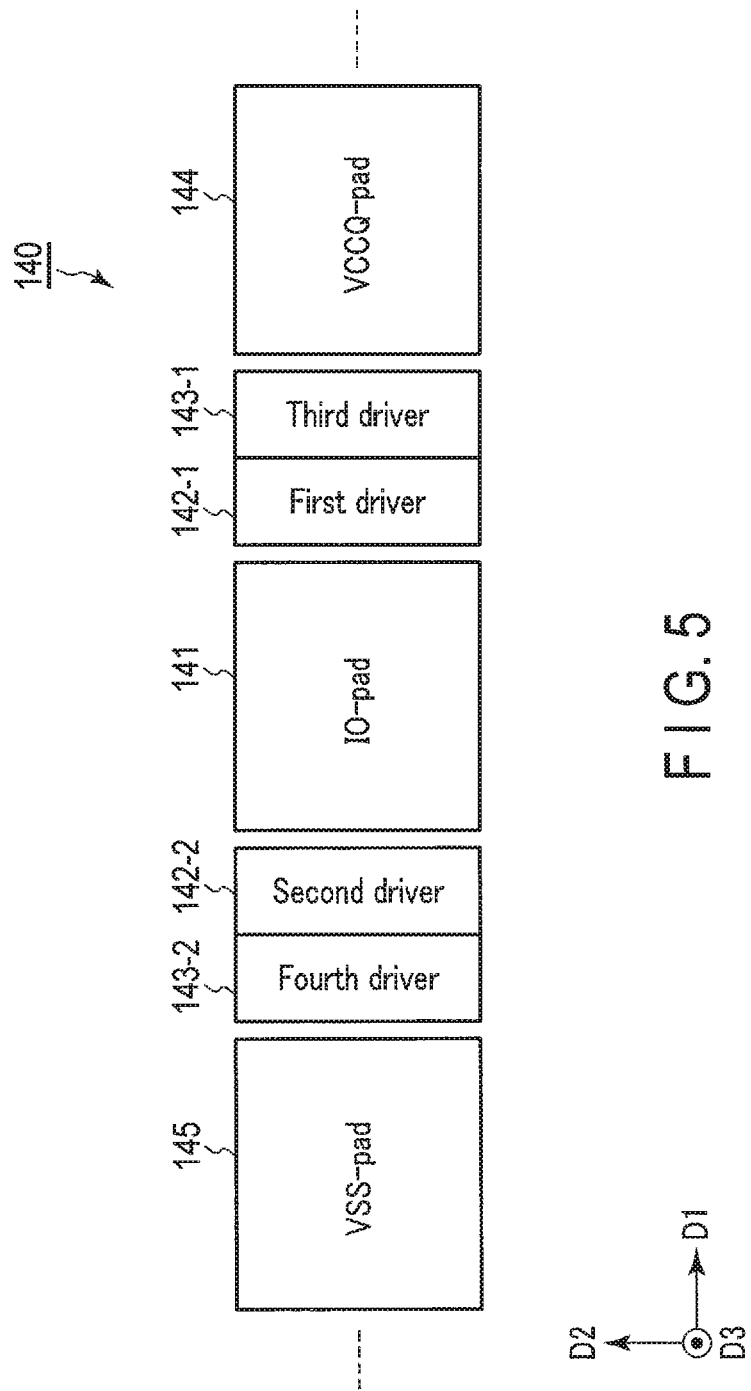
FIG. 5 is a diagram illustrating the layout of part of the input/output terminal of a semiconductor memory device according to an embodiment.

As shown in FIG. 5, an IO-pad 141 is interposed between the first driver 142-1 and the second driver 142-2, as viewed in direction D1. Although only one IO-pad 141 is shown, a plurality of IO-pads may be arranged in direction D1. The IO-pad 141 is a pad for supplying and receiving signals. For example, where the IO-pad 141 is a pad for supplying and receiving data signals DQ, the NAND flash memory 100 supplies and receives the data signals DQ via the IO-pad 141. For example, where the IO-pad 141 is a pad for supplying and receiving the data strobe signal DQS, the NAND flash memory 100 supply the data strobe signal DQS to the memory controller 200 via the IO-pad 141.

The third driver 143-1 is interposed between the first driver 142-1 and a VCCQ-pad 144, as viewed in direction D1.

The fourth driver 143-2 is interposed between the second driver 142-2 and a VSS-pad 145, as viewed in direction D1.

The VCCQ-pad 144 is provided so that a voltage VCCQ supplied from the host 2 can be supplied to the NAND flash memory 100.

The VSS-pad 145 is provided so that a voltage VSS supplied from the host 2 can be supplied to the NAND flash memory 100.

The VCCQ-pad 144 and the VSS-pad 145 may be referred to simply as power supply pads.

<1-3-2> Circuits of First Driver 142-1 and Third Driver 143-1

Figure 6:
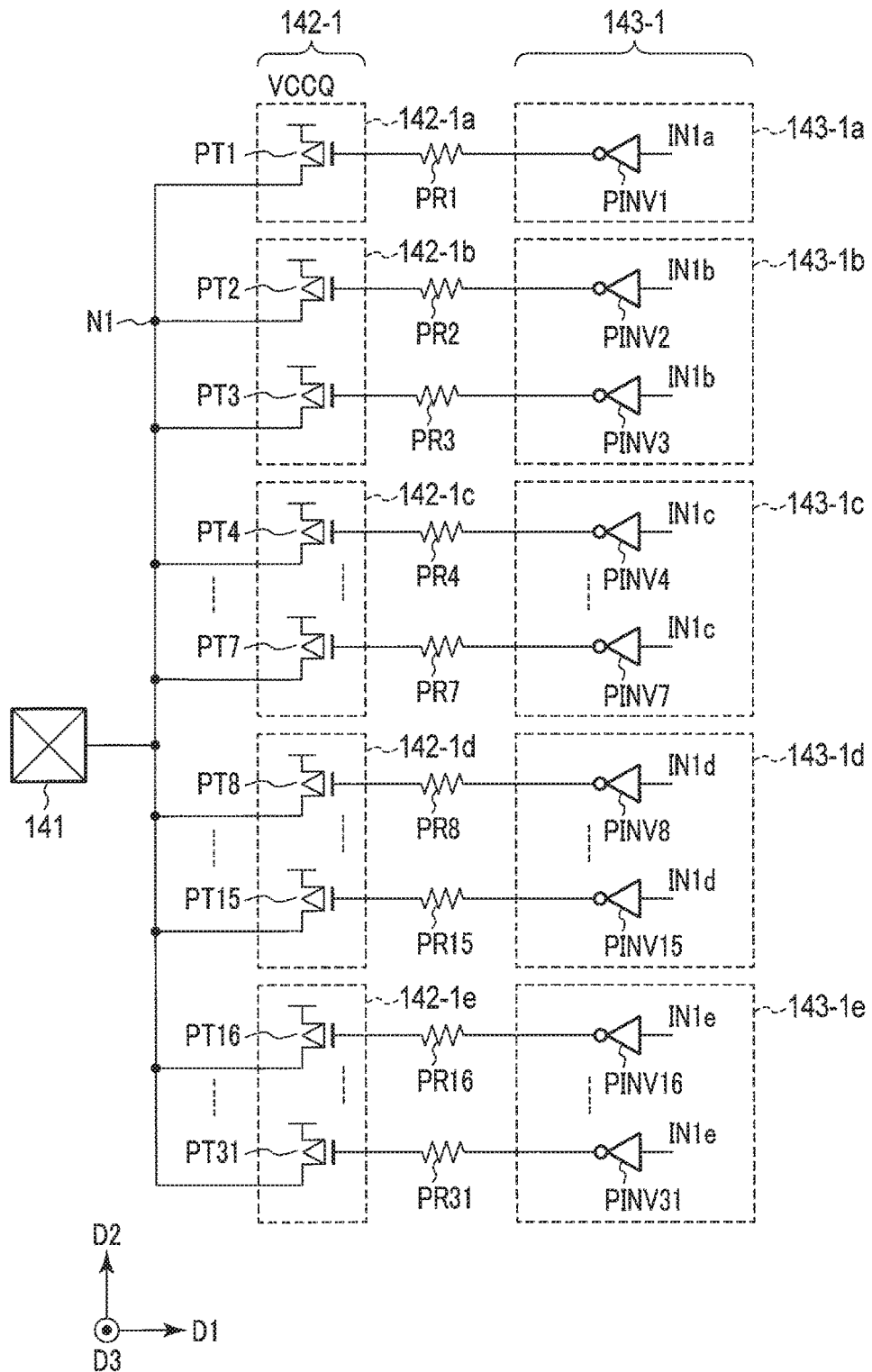
FIG. 6 is a circuit diagram illustrating first and third drivers of a semiconductor memory device according to an embodiment.

The circuits of the first driver 142-1 and the third driver 143-1 will be described with reference to FIG. 6.

As described above, the first driver 142-1 controls (i.e. regulates) the rise of an output signal waveform. For example, the first driver 142-1 is provided with a plurality of PMOS transistors PT serving as switches (e.g., 31 PMOS transistors PT1 to PT31 in the present embodiment). The 31 PMOS transistors PT are controlled so that one of them, two of them, four of them, eight of them, and sixteen of them in units are respectively controlled. The region related to the unit of one PMOS transistor PT1 are labeled as driver 142-1a, the region related to the unit of two PMOS transistors PT2 and PT3 are labeled as driver 142-1b, the region related to the unit of four PMOS transistors PT4 to PT7 are labeled as driver 142-1c, the region related to the unit of eight PMOS transistors PT8 to PT15 are labeled as driver 142-1*d*, and the region related to the unit of sixteen PMOS transistors PT16 to PT31 are labeled as driver 142-1*e*.

The third driver 143-1 is provided with an inverter PINV for operating every one PMOS transistor PT. The region in which inverter PINV1 is provided is labeled as driver 143-1*a*, the region in which inverters PINV2 and PINV3 are provided is labeled as driver 143-1*b*, the region in which inverters PINV4 to PINV7 are provided is labeled as driver 143-1*c*, the region in which inverters PINV8 to PINV15 are provided is labeled as driver 143-1*d*, and the region in which inverters PIN 16 to PINV31 are provided is labeled as driver 143-1*e*.

The first driver 142-1 and the third driver 143-1 are connected together, with resistor elements PR interposed. Specifically, the PMOS transistor PT1 is connected to the inverter PINV1 via a resistor element PR1. Likewise, the PMOS transistors PT2 to PT31 are connected to the inverters PINV2 to PINV31 via resistor elements PR2 to PR31, respectively.

As will be described later, the resistor elements PR1 to PR31 are provided as wiring resistances. The wiring lines from the inverters PINV1-PINV31 to the PMOS transistors PT1-PT31 have a substantially equal distance. Therefore, resistor elements PR1 to PR31 realized by the wiring resistances have a substantially equal resistance value.

Upon receipt of a signal IN1*a* from the peripheral circuits 150 (e.g., the control circuit 150*b*), the driver 143-1*a* supplies a control signal to PMOS transistor PT1. When an "H"-level control signal is received from driver 143-1*a*, the PMOS transistor PT1 supplies voltage VCCQ to the pad 141 via node N1.

Upon receipt of a signal IN1*b* from the peripheral circuits 150 (e.g., the control circuit 150*b*), the driver 143-1*b* supplies control signals to both PMOS transistors PT2 and PT3. When "H"-level control signals are received from driver 143-1*b*, PMOS transistors PT2 and PT3 supply the voltage VCCQ to the pad 141 via node N1.

Upon receipt of a signal IN1*c* from the peripheral circuits 150 (e.g., the control circuit 150*b*), the driver 143-1*c* supplies control signals to the PMOS transistors PT4 to PT7. When "H"-level control signals are received from the driver 143-1*c*, the PMOS transistors PT4 to PT7 supply the voltage VCCQ to the pad 141 via node N1.

Upon receipt of a signal IN1*d* from the peripheral circuits 150 (e.g., the control circuit 150*b*), the driver 43-1*d* supplies control signals to the PMOS transistors PT8 to PT15. When "H"-level control signals are received from the driver 143-1*d*, the PMOS transistors PT8 to PT15 supply the voltage VCCQ to the pad 141 via node N1.

Upon receipt of a signal IN1*e* from the peripheral circuits 150 (e.g., the control circuit 150*b*), the driver 143-1*e* supplies control signals to the PMOS transistors PT16 to PT31. When "H"-level control signals are received from driver 143-1*e*, the PMOS transistors PT16 to PT31 supply the voltage VCCQ to the pad 141 via node N1.

<1-3-3> Circuits of Part of First Driver 142-1 and Third Driver 143-1

Circuits of part of the first driver 142-1 and the third driver 143-1 will be described with reference to FIG. 7.

Described herein is a circuit including a set of a PMOS transistors PT (the first driver 142-1), a resistor element PR, and an inverter PINV (the third driver 143-1).

Figure 7:
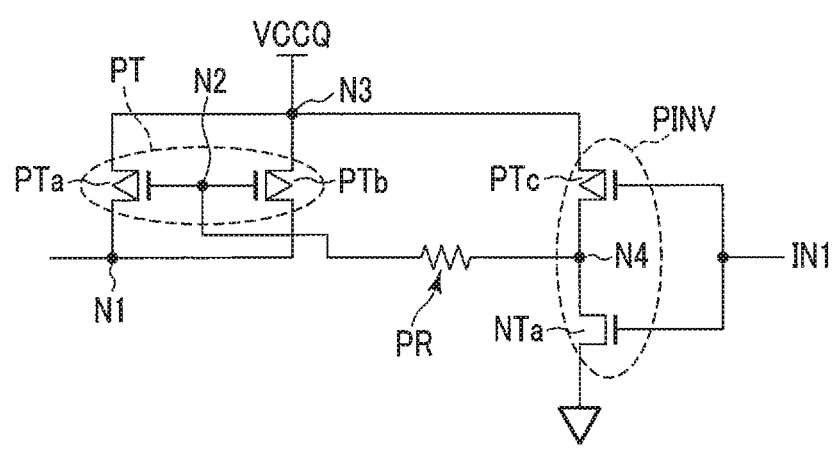
FIG. 7 is a circuit diagram illustrating part of the first and third drivers of a semiconductor memory device according to an embodiment.

As shown in FIG. 7, the inverter PINV includes, for example, a PMOS transistor FTC and an NMOS transistor NTa. The source of the PMOS transistor PTc is connected to a VCCQ-pad via a node N3, the gate electrode of the PMOS transistor PTc is supplied with signal IN1 (i.e. one of signals IN1*a* to IN1*e*), and the drain of the PMOS transistor PTc is connected to node N4. The drain of NMOS transistor NTa is connected to node N4, the gate electrode of NMOS transistor NTa is supplied with signal IN1 (i.e. one of signals IN1*a* to IN1*e*), and the source of NMOS transistor NTa is connected to a VSS-pad.

One end of resistor element PR is connected to node N4, and the other end is connected to node N2.

As shown in FIG. 7, the PMOS transistors PT include, for example, two PMOS transistors PTa and PTb. The source of the PMOS transistor PTa is connected to the VCCQ-pad via node N3, the gate electrode of the PMOS transistor PTa is connected to node N2, and the drain of the PMOS transistor PTa is connected to the IO-pad via a node N1. The source of the PMOS transistor PTb is connected to the VCCQ-pad via the node N3, the gate electrode of the PMOS transistor PTb is connected to the node N2, and the drain of the PMOS transistor PTb is connected to the IO-pad via the node N1.

For example, where the signal IN1 is at the "H" level, the PMOS transistor PTc is set to the OFF state, NMOS transistor NTa is set to the ON state, and the potential of node N2 becomes the "L" level. Accordingly, the PMOS transistors PTa and PTb are turned on, and the voltage VCCQ is supplied to the node N1.

Where the signal IN1 is at the "L" level, the PMOS transistor PTc is set to the ON state, the NMOS transistor NTa set to the OFF state, and the potential of node N2 becomes the "H" level. Accordingly, the PMOS transistors PTa and PTb are turned off.

<1-3-4> Layout of Part of First Driver 142-1 and Third Driver 143-1

Figure 8:
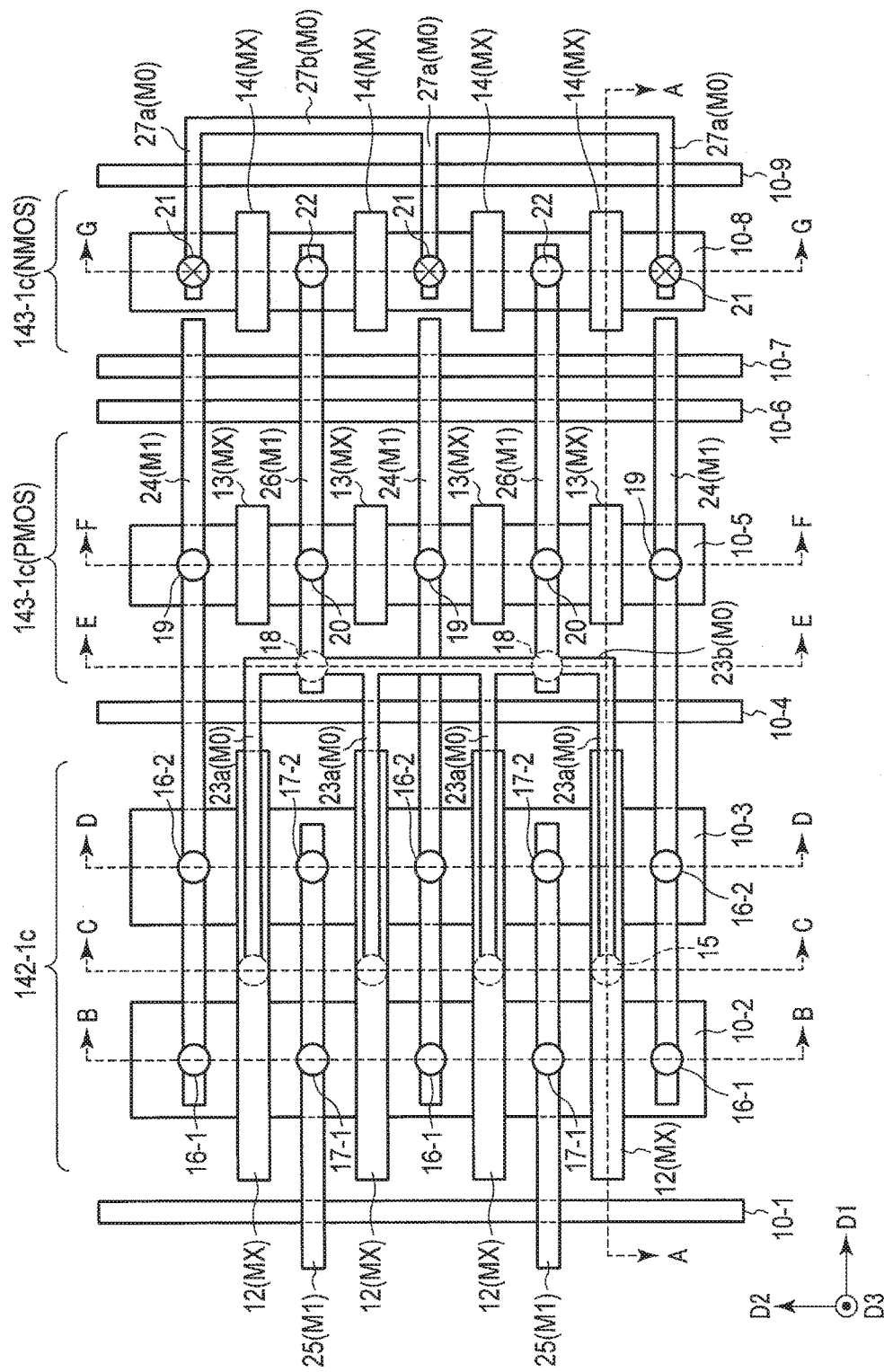
FIG. 8 is a diagram illustrating the layout of part of the first and third drivers of a semiconductor memory device according to an embodiment.

A layout of part of the first driver 142-1 and the third driver 143-1 will be described with reference to FIG. 8. Reference will be made only to the driver 142-1*c* and the driver 143-1*c*. In FIG. 8, conductors and impurity regions are illustrated for simplicity.

Figure 9:
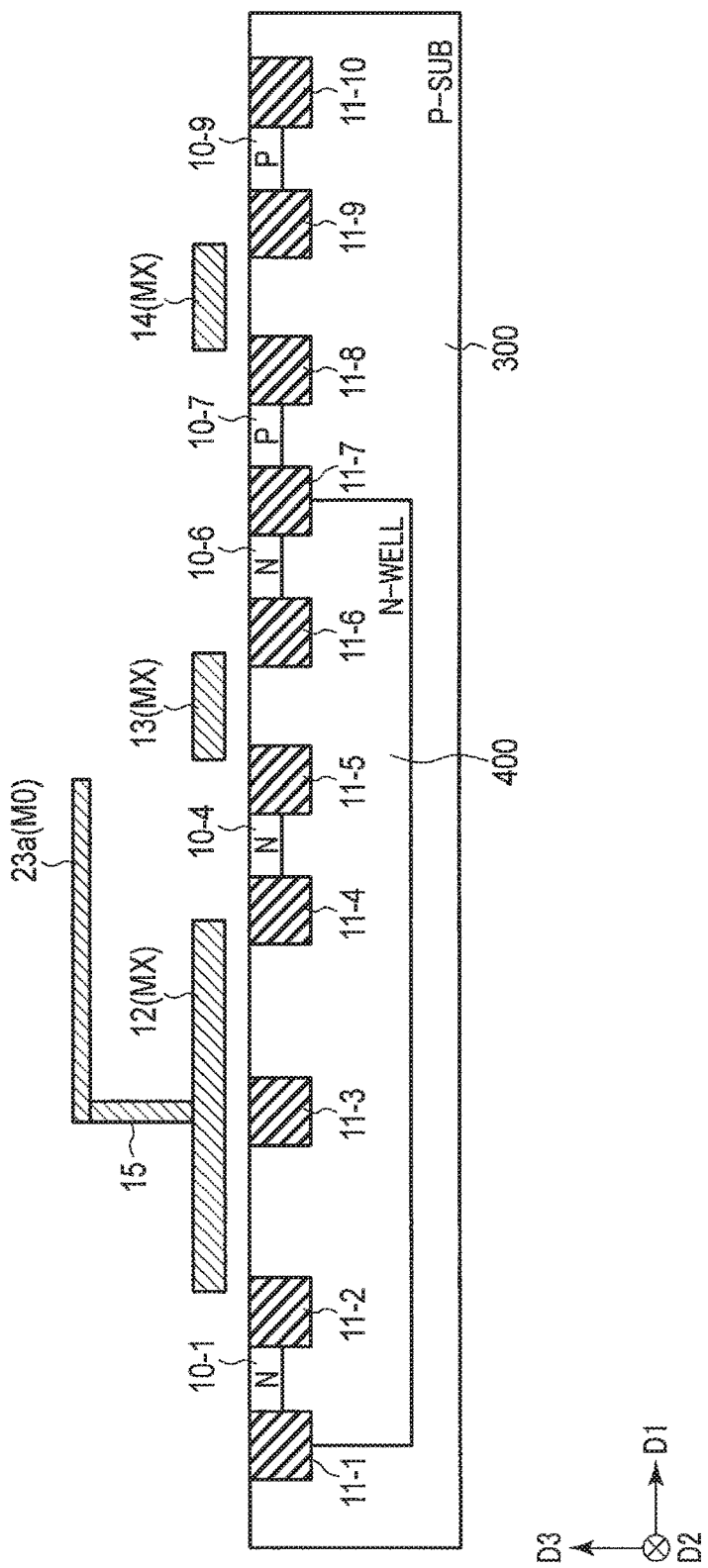
FIG. 9 is a sectional view taken in the direction along line A-A in FIG. 8.

As shown in FIGS. 8 to 10, a well region (N-WELL) 400 containing N-type impurities is formed in a surface region of a P-type semiconductor substrate (P-SUB) 300. A plurality of impurity regions (source/drain regions) 10-2 containing P-type impurities are formed in a surface region of the well region 400. The regions between adjacent two impurity regions 10-2 are channel regions CHN each functioning as a channel. Insulating films (not shown) are formed above the channel regions CHN, and gate electrodes 12 made of a conductive material are formed on the insulating films. One of the gate electrodes 12, one of the channel regions CHN, and the two impurity regions 10-2 sandwiching the one channel region CHN jointly function as the PMOS transistor PTa.

Contacts 16-1 made of a conductive material are provided on each of those impurity regions 10-2 functioning as a source, and the contacts 16-1 are connected to wiring lines 24 made of a conductive material. The wiring lines 24 are electrically connected to the VCCQ-pad. Contacts 17-1 made of a conductive material are provided on each of the other impurity regions 10-2 functioning as a drain, and the contacts 17-1 are connected to wiring lines 25 made of a conductive material. The wiring lines 25 are electrically connected to the IO-pad.

The gate electrodes 12 are located at the height labeled as "MX" (the height as defined in the direction D3), and the wiring lines 24 and 25 are located at the height labeled as "M1 (MX<M1)".

As shown in FIG. 8, a plurality of PMOS transistors PTa are arranged in parallel in the direction D2. As described above, only the PMOS transistors PTa for the driver 142-1*c* are illustrated in FIG. 8, but the PMOS transistors PTa for the drivers 142-1a, 142-1b, 142-1d, and 142-1e are likewise arranged in parallel in the direction D2.

As shown in FIGS. 8, 9, and 11, contacts 15 made of a conductive material are provided on the gate electrodes 12, and the contacts 15 are connected to wiring lines 23a and 23b. The wiring lines 23a and 23b are located at the height labeled as "M0 (MX<M0<M1)" (the height as defined in the direction D3). The wiring lines 23a and 23b have higher resistance than that of the wiring lines labeled as "M1." Therefore, the wiring lines 23a and 23b function as the resistor elements PR mentioned above.

As shown in FIGS. 8, 9, and 12, a plurality of impurity regions (source/drain region 10-3 containing P-type impurities are formed in a surface region of the well region 400. The regions between adjacent two impurity regions 10-3 are channel regions CHN each functioning as a channel. Insulating films (not shown) are formed above the channel regions CHN, and gate electrodes 12 made of a Conductive material are formed on the insulating films. One of the gate electrodes 12, one of the channel regions CHN and the two impurity regions 10-3 sandwiching the one channel region CHN jointly function as the PMOS transistor PTb.

Contacts 16-2 made of a conductive material are provided on each of those impurity regions 10-3 functioning as a source, and the contacts 16-2 are connected to wiring lines 24 made of a conductive material. The wiring lines 24 are electrically connected to the VCCQ-pad. Contacts 17-2 made of a conductive material are provided on each of the other impurity regions 10-3 functioning as a drain, and the contacts 17-2 are connected to wiring lines 25 made of a conductive material. The wiring lines 25 are electrically connected to the IO-pad.

As shown in FIG. 8, a plurality of PMOS transistors PTa and PTb are arranged in parallel in the direction D2. As described above, only the PMOS transistors PTb for the driver 142-1c are illustrated in FIG. 8, but the PMOS transistors PTb for the drivers 142-1a, 142-1b, 142-1d, and 142-1e are likewise arranged in parallel in the direction D2.

As shown in FIG. 8, impurity regions 10-1 and 10-4 functioning as a guard ring extend in the direction D2, and sandwich the PMOS transistors PTa and PTb as viewed in the direction D1.

As shown in FIGS. 8, 9, and 13, one or more contacts 16 made of a conductive material are provided on the wiring line 23b and are connected to one or more wiring lines 26 made of a conductive material. The one or more wiring lines 26 are located at the height labeled as "M1" (the height as defined in the direction D3). The one or more wiring lines 26 have higher resistance than that of the wiring lines labeled as "M0."

As shown in FIGS. 8, 9, and 14, a plurality of impurity regions (source/drain regions) 10-5 containing P-type impurities are formed in a surface region of the well region 400. The regions between adjacent two impurity regions 10-5 are channel regions CHN each functioning as a channel. Insulating films (not shown) are formed above the channel regions CHN, and gate electrodes 13 made of a conductive material are formed on the insulating films. One of the gate electrodes 13, one of the channel regions CHN, and the two impurity regions 10-5 sandwiching the one channel region CHN jointly function as the PMOS transistor PTc.

Contacts 19 made of a conductive material are provided on each of those impurity regions 10-5 functioning as a source, and the contacts 19 are connected to wiring lines 24 made of a conductive material. The wiring lines 24 are electrically connected to the VCCQ-pad. Contact 20 made of a conductive material are provided on each of the other impurity regions 10-5 functioning as a drain, and the contacts 20 are connected to wiring lines 26 made of a conductive material.

As shown in FIG. 8, a plurality of PMOS transistors PTc are arranged in parallel in the direction D2. As described above, only the PMOS transistors PTc for the driver 143-1c are illustrated in FIG. 8, but the PMOS transistors PTc for the drivers 143-1a, 143-1b, 143-1d, and 143-1e are likewise arranged in parallel in the direction D2.

The one or more gate electrodes 13 are located at the height labeled as "MX" (the height as defined in the direction D3).

As shown in FIG. 8, impurity regions 10-4 and 10-6 functioning as a guard ring extend in the direction D2, and sandwich the one or more PMOS transistors PTc as viewed in direction D1.

As shown in FIGS. 8, 9, and 15, a plurality of impurity regions (source/drain regions) 10-8 containing N-type impurities are formed in a surface region of the semiconductor substrate 300. The regions between adjacent two impurity regions 10-8 are channel regions CHN each functioning as a channel. Insulating films (not shown are formed above the channel regions CHN, and gate electrodes 14 made of a conductive material are formed on the insulating films. One of the gate electrodes 14, one of the channel regions CHN, and the two impurity regions 10-8 sandwiching the one channel region CHN jointly function as the NMOS transistor NTa.

Contacts 21 made of a conductive material are provided on each of those impurity regions 10-8 functioning as a source, and the contacts 21 are connected to wiring lines 27a and 27b made of a conductive material. The wiring lines 27a and 27b are electrically connected to the VSS-pad.

Contacts 22 made of a conductive material are provided on each of the other impurity regions 10-8 functioning as a drain, and the contacts 22 are connected to wiring lines 26 made of a conductive material.

As shown in FIG. 8, a plurality of NMOS transistors NTa are arranged in parallel in the direction D2. As described above, only the NMOS transistors NTa for the driver 143-1c are illustrated in FIG. 8, but the NMOS transistors NTa for the drivers 143-1a, 143-1b, 143-1d, and 143-1e are likewise arranged in parallel in the direction D2.

The one or more gate electrodes 14 are located at the height labeled as "MX" (the height as defined in the direction D3), and the wiring lines 27a and 27b are located at the height labeled as "M0" (the height as defined in the direction D3).

As shown in FIG. 8, impurity regions 10-7 and 10-9 functioning as a guard ring extend in the direction D2, and sandwich the NMOS transistors NTa as viewed in the direction D1.

<1-3-5> Circuits of Second Driver 142-2 and Fourth Driver 143-2

Figure 16:
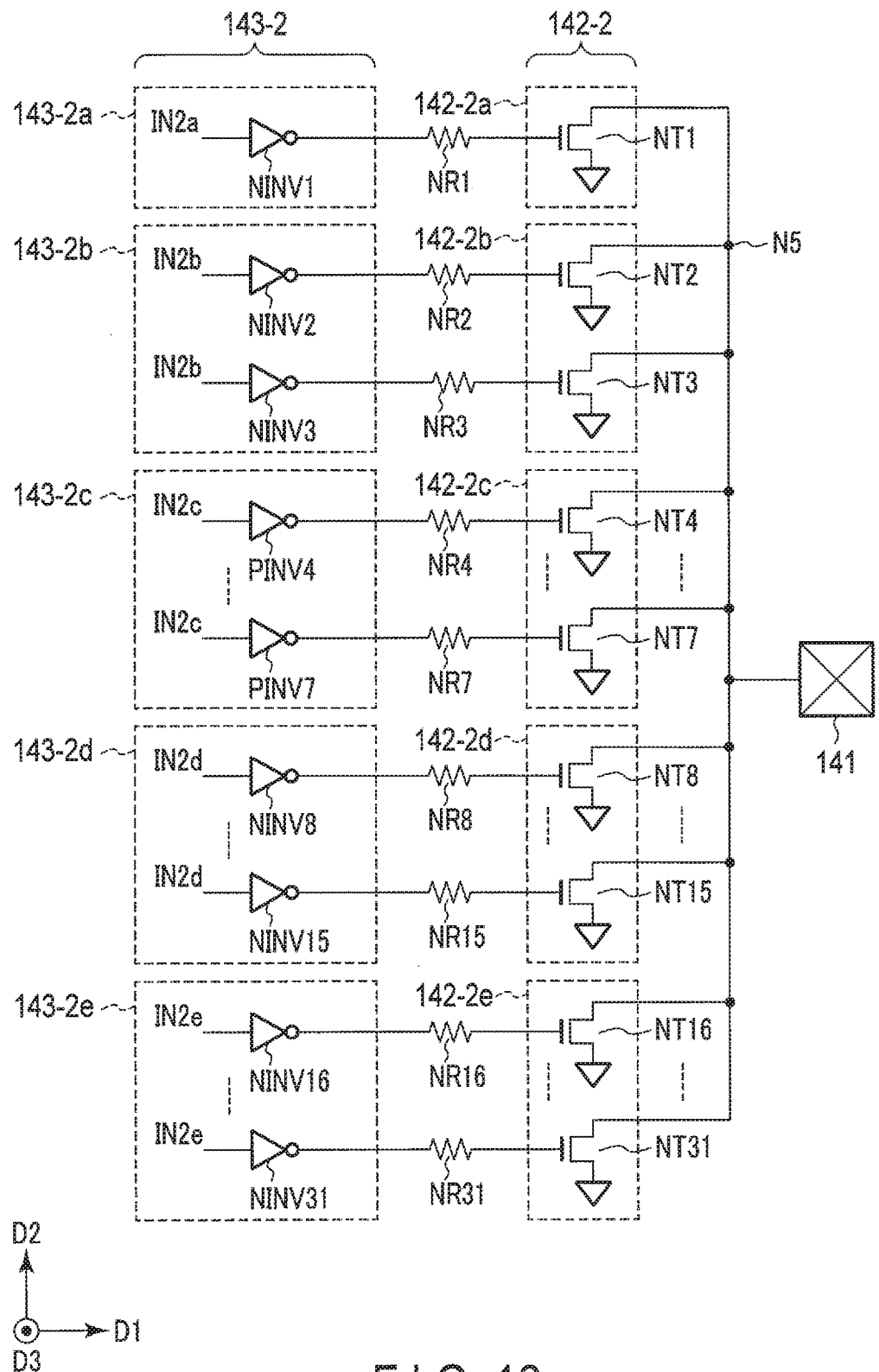
FIG. 16 is a circuit diagram illustrating second and fourth drivers of a semiconductor memory device according to an embodiment.

The circuits of the second driver 142-2 and the fourth driver 143-2 will be described with reference to FIG. 16.

As described above, the second driver 142-2 controls (i.e. regulates) the fall of an output signal waveform. For example, the second driver 142-2 is provided with a plurality of NMOS transistors NT serving as switches (e.g., 31 NMOS transistors NT1 to NT31 in the present embodiment). The 31 NMOS transistors NT are controlled so that one of them, two of them, four of them, eight of them, and sixteen of them in units are respectively controlled. The region related to the unit of one NMOS transistor NT1 is labeled as driver 142-2a, the region related to the unit of two NMOS transistors NT2 and NT3 is labeled as driver 142-2*b*, the region related to the unit of four NMOS transistors NT4 to NT7 is labeled as driver 142-2*c*, the region related to the unit of eight NMOS transistors NT8 to NT15 is labeled as driver 142-2*d*, and the region related to the unit of sixteen NMOS transistors NT16 to NT 31 is labeled as driver 142-2*e*.

The fourth driver 143-2 is provided with an inverter NINV for operating one NMOS transistor NT. The region in which one inverter NINV1 is provided is labeled as driver 143-2*a*, the region in which inverters NINV2 and NINV3 are provided is labeled as driver 143-2*b*, the region in which inverters NINV4 to NINV7 are provided is labeled as driver 143-2*c*, the region in which inverters NINV8 to NINV15 are provided is labeled as driver 143-2*d*, and the region in which inverters NINV16 to NINV31 are provided is labeled as driver 143-2*e*.

The second driver 142-2 and the fourth driver 143-2 are connected together, with resistor elements NR interposed. Specifically, the NMOS transistor NT1 is connected to the inverter NINV1 via a resistor element NR1. Likewise, the NMOS transistors NT2 to NT31 are connected to the inverters NINV2 to NINV31 via resistor elements NR2 to NR31, respectively.

As will be described later, the resistor elements NR1 to NR31 are provided as wiring resistance. The wiring lines from the inverters NINV1-NINV31 to the NMOS transistors NT1-NT31 have a substantially equal distance. Therefore, the resistor elements NR1 to NR31 realized by the wiring resistance have a substantially equal resistance value.

Upon receipt of a signal IN2*a* from the peripheral circuits 150 (e.g., the control circuit 150*b*), the driver 143-2*a* supplies a control signal to the NMOS transistor NT1. When an "L"-level control signal is received, from the driver 143-2*a*, the NMOS transistor NT1 supplies a voltage VSS to the pad 141 via a node N5.

Upon receipt of a signal IN2*b* from the peripheral circuits 150 (e.g., the control circuit 150*b*), the driver 143-2*b* supplies a control signal to the NMOS transistors NT2 and NT3. When an "L"-level control signal is received from the driver 143-2*b*, the NMOS transistors NT2 and NT3 supply a voltage VSS to the pad 141 via the node N5.

Upon receipt of a signal IN2*c* from the peripheral circuits 150 (e.g., the control circuit 150*b*), the driver 143-2*c* supplies a control signal to the NMOS transistors NT4 to NT7. When an "L"-level control signal is received from the driver 143-2*c*, the NMOS transistors NT4 to NT7 supply a voltage VSS to the pad 141 via the node N5.

Upon receipt of a signal IN2*d* from the peripheral circuits 150 (e.g., the control circuit 150*b*), the driver 143-2*d* supplies a control signal to the NMOS transistors NT8 to NT15. When an "L"-level control signal is received from the driver 143-2*d*, the NMOS transistors NT8 to NT15 supply a voltage VSS to the pad 141 via the node N5.

Upon receipt of a signal IN2*e* from the peripheral circuits 150 (e.g., the control circuit 150*b*), the driver 143-2*e* supplies a control signal to the NMOS transistors NT16 to NT31. When an "L"-level control signal is received from the driver 143-2*e*, the NMOS transistors NT16 to NT31 supply a voltage VSS to the pad 141 via the node N5.

<1-3-5> Circuits of Part of Second Driver 142-2 and Fourth Driver 143-2

Circuits of part of the second driver 142-2 and the fourth driver 143-2 will be described with reference to FIG. 17.

Described herein is a circuit including a set of an NMOS transistor NT, a resistor element NR, and an inverter NINV.

As shown in FIG. 17, the inverter NINV includes, for example, a PMOS transistor PTd and an NMOS transistor NTd. The source of the PMOS transistor PTd is connected to the VCCQ-pad, the gate electrode of the PMOS transistor PTd is supplied with the signal IN2 (any one of the signals IN2*a* to IN2*e*), and the drain of the PMOS transistor PTd is connected to a node N8. The drain of the NMOS transistor NTd is connected to the node N8, the gate electrode of the NMOS transistor NTd is supplied with signal IN2 (one of signals IN2*a* to IN2*e*), and the source of the NMOS transistor NTd is connected to the VSS-pad via a node N7.

One end of the resistor element NR is connected to the node N8, and the other end is connected to a node N6.

As shown in FIG. 17, the NMOS transistors NT include, for example, two NMOS transistors NTb and NTc. The drain of the NMOS transistor NTb is connected to the IO-pad via a node N5, the gate electrode of the NMOS transistor NTb is connected to the node N6, and the source of the NMOS transistor NTb is connected to the VSS-pad via the node N7. The drain of the NMOS transistor NTc is connected to the IO-pad via the node N5, the gate electrode of the NMOS transistor NTc is connected to the node N6, and the source of the NMOS transistor NTc is connected to the VSS-pad via the node N7.

For example, where the signal IN2 is at the "H" level, the PMOS transistor PTd is set to the OFF state, the NMOS transistor NTd is set to the ON state, and the potential of node N8 becomes the "L" level. Accordingly, the NMOS transistors NTb and NTc are turned off.

Where the signal IN2 is at the "L" level, the PMOS transistor PTd is set to the ON state, the NMOS transistor NTd is set to the OFF state, and the potential of node N8 becomes the "H" level. Accordingly, the NMOS transistors NTb and NTc are turned on, and the voltage VSS can be supplied to the IO-pad.

<1-3-7> Layout of Part of Second Driver 142-2 and Fourth Driver 143-2

A layout of part of the second driver 142-2 and the fourth driver 143-2 will be described with reference to FIG. 18. Reference will be made to only the driver 142-2*c* and the driver 143-2*c*. In FIG. 18, conductors and impurity regions are illustrated for simplicity.

Figure 19:
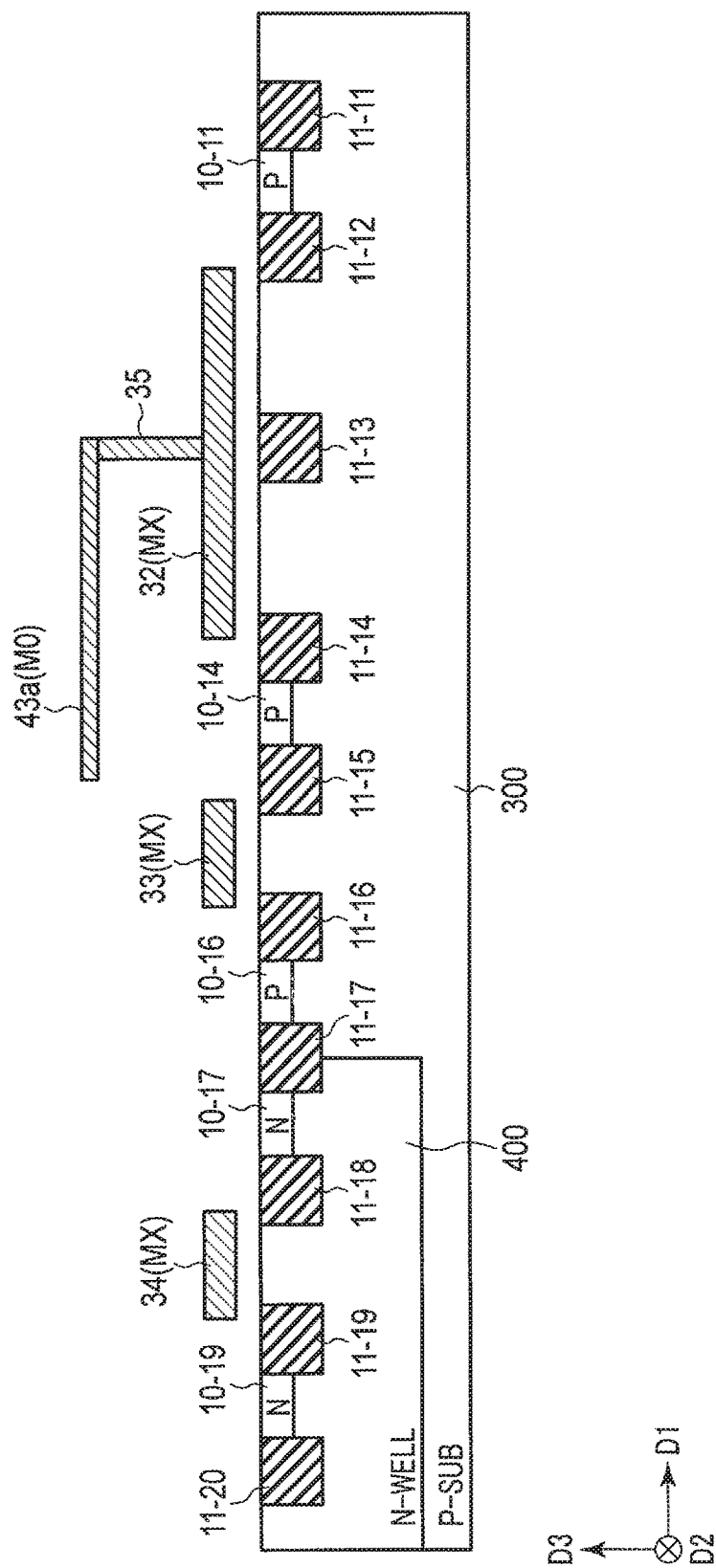
FIG. 19 is a sectional view taken in the direction along line H-H in FIG. 18.

As shown in FIGS. 18 to 20, a plurality of impurity regions (source/drain regions) 10-12 containing N-type impurities are formed in a surface region of the P-type semiconductor substrate (P-SUB) 1. The regions between adjacent two impurity regions 10-12 are channel regions CHN each functioning as a channel. Insulating films (not shown) are formed above the channel regions CHN, and gate electrodes 32 made of a conductive material are formed on the insulating films. One of the gate electrodes 32, one of the channel regions CHN, and the two impurity regions 10-12 sandwiching the one channel region CHN jointly function as the NMOS transistor NTb.

Contacts 36-1 made of a conductive material are provided on each of those impurity regions 10-12 functioning as a source, and the contacts 36-1 are connected to wiring lines 44 made of a conductive material. The wiring lines 44 are electrically connected to the VSS-pad. Contacts 37-1 made of a conductive material are provided on each of the other impurity regions 10-12 functioning as a drain, and the contacts 37-1 are connected to wiring lines 45 made of a conductive material. The wiring lines 45 are electrically connected to the IO-pad.

The one or more gate electrodes 32 are located at the height labeled as "Mx" (the height as defined in the direction D3), and the wiring lines 44 and 45 are located at the height labeled as "M1 (MX<M1)."

As shown in FIG. 18, a plurality of NMOS transistors NTb are arranged in parallel in the direction D2. As described above, only the MOS transistors NTb for the driver 142-2c are illustrated in FIG. 18, but the NMOS transistors NTb for the drivers 142-2a, 142-2b, 142-2d, and 142-2e are likewise arranged in parallel in the direction D2.

As shown in FIGS. 18, 19, and 21, contacts 35 made of a conductive material are provided on the gate electrodes 32, and the contacts 35 are connected to wiring lines 43a and 43b. The wiring lines 43a and 43b are located at the height labeled as "M0 (MX<M0<M1)" (the height as defined in the direction D3). The wiring lines 43a and 43b have higher resistance than that of the wiring lines labeled as "M1." Therefore, the wiring lines 43a and 43b function as the resistor elements NR mentioned above.

Figure 22:
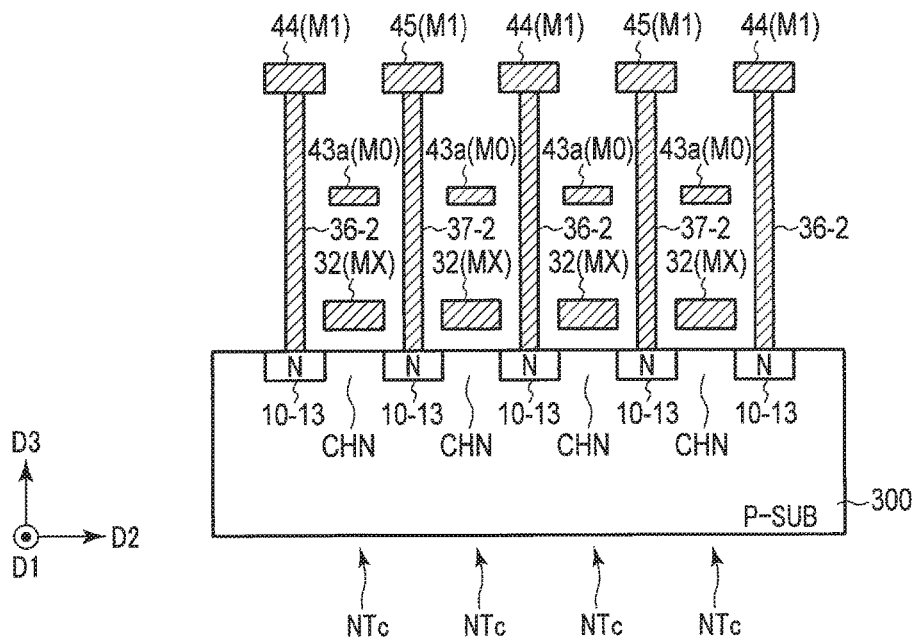
FIG. 22 is a sectional view taken in the direction along line K-K in FIG. 18.

As shown in FIGS. 18, 19, and 22, a plurality of impurity regions (source/drain regions) 10-13 containing N-type impurities are formed in a surface region of the semiconductor substrate 300. The regions between adjacent two impurity regions 10-13 are channel regions CHN each functioning as a channel. Insulating films (not shown) are formed above the channel regions CHN, and gate electrodes 32 made of a conductive material are formed on the insulating films. One of the gate electrodes 32, one of the channel regions CHN, and the two impurity regions 10-13 sandwiching the one channel region CHN jointly function as the NMOS transistor NTb.

Contacts 36-2 made of a conductive material are provided on each of those impurity regions 10-13 functioning as a source, and the contacts 36-2 are connected to wiring lines 44 made of a conductive material. The wiring lines 44 are electrically connected to the VSS-pad. Contacts 37-2 made of a conductive material are provided on each of the other impurity regions 10-13 functioning as a drain, and the contacts 37-2 are connected to wiring lines 45 made of a conductive material. The wiring lines 45 are electrically connected to the IO-pad.

Thus, as shown in FIG. 18, the NMOS transistors NTc are arranged in parallel in the direction D2. As described above, only the NMOS transistors NTc for the driver 142-2c are illustrated in FIG. 18, but the NMOS transistors NTc for the drivers 142-2a, 142-2b, 142-2d, and 142-2e are likewise arranged in parallel in the direction D2.

As shown in FIG. 18, impurity regions 10-11 and 10-14 functioning as a guard ring extend in the direction D2, and sandwich the NMOS transistors NTb and NTc as viewed in the direction D1.

Figure 23:
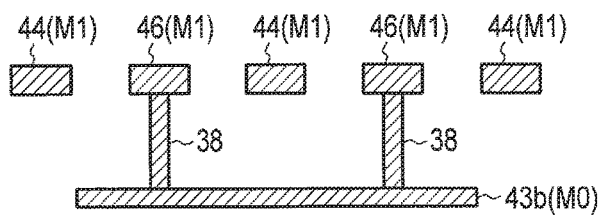
FIG. 23 is a sectional view taken in the direction along line L-L in FIG. 18.
Figure 23:

As shown in FIGS. 18, 19, and 23, Contacts 38 made of a conductive material are provided on wiring lines 43b and are connected to wiring lines 46 made of a conductive material. The wiring lines 46 are located at the height labeled as "M1" (the height as defined in the direction D3). The wiring lines 46 have higher resistance than that of the wiring lines labeled as "M0."

As shown in FIGS. 18, 19, and 24, a plurality of impurity regions (source/drain regions) 10-15 containing N-type impurities are formed in a surface region of the semiconductor substrate 300. The regions between adjacent two impurity regions 10-15 are channel regions CHN each functioning as a channel. Insulating films (not shown) are formed above the channel regions CHN, and gate electrodes 33 made of a conductive material are formed on the insulating films. One of the gate electrodes 33, one of the channel regions CHN, and the two impurity regions 10-15 sandwiching the one channel region CHN jointly function as the NMOS transistor NTd.

Contacts 39 made of a conductive material are provided on each of those impurity regions 10-15 functioning as a source, and the contacts 39 are connected to wiring lines 44 made of a conductive material. The wiring lines 44 are electrically connected to the VSS-pad. Contacts 40 made of a conductive material are provided on each of the other impurity regions 10-15 functioning as a drain, and the contacts 40 are connected to wiring lines 46 made of a conductive material.

As shown in FIG. 18, a plurality of NMOS transistors NTd are arranged in parallel in the direction D2. As described above, only the NMOS transistors NTd for the driver 143-2c are illustrated in FIG. 18, but the NMOS transistors NTd for the drivers 143-2a, 143-2b, 143-2d, and 143-2e are likewise arranged in parallel in the direction D2.

One or more gate electrode 33 is located at the height labeled as "MX" (the height as defined in the direction D3).

As shown in FIG. 18, impurity regions 10-14 and 10-16 functioning as a guard ring extend in the direction D2, and sandwich the NMOS transistors NTd as viewed in the direction D1.

As shown in FIGS. 18, 19 and 25, a well region (N-WELL) 2 containing N-type impurities is formed in a surface region of the semiconductor substrate 300. A plurality impurity regions (source/drain regions) 10-18 containing P-type impurities are formed in a surface region of the well region 400. The regions between adjacent two impurity regions 10-18 are channel regions CHN each functioning as a channel. Insulating films (not shown) are formed above the channel regions CHN, and gate electrodes 34 made of a conductive material are formed on the insulating films. One of the gate electrodes 34, one of the channel regions CHN and the two impurity regions 10-18 sandwiching the one channel region CHN jointly function as the PMOS transistor PTd.

Contacts 41 made of a conductive material are provided on each of those impurity regions 10-18 functioning as a source, and the contacts 41 are connected to wiring lines 47a and 47b made of a conductive material. The wiring lines 47a and 47b are electrically connected to the VSS-pad. Contacts 42 made of a conductive material are provided on each of the other impurity regions 10-18 functioning as a drain, and the contacts 42 are connected to wiring lines 46 made of a conductive material.

As shown in FIG. 18, the PMOS transistors PTd are arranged in parallel in the direction D2. As described above, only the PMOS transistors PTd for the driver 143-2c are illustrated in FIG. 18, but the PMOS transistors PTd for the drivers 143-2a, 143-2b, 143-2d, and 143-2e are likewise arranged in parallel in the direction D2.

The one or more gate electrodes 34 are located at the height labeled as "MX" (the height as defined in the direction. D3), and the wiring lines 47a and 47b are located at the height labeled as "M0" (the height as defined in the direction D3).

As shown in FIG. 18, impurity regions 10-17 and 10-19 functioning as a guard ring extend in the direction D2, and sandwich the PMOS transistors PTd as viewed in the direction D1.

<1-4> Advantages

As described above, in the semiconductor memory device of the present embodiment, the off-chip driver and the pre-driver are provided between the IO-pad and the power supply pad. With this configuration, the following advantages are attained.

<1-4-1> Advantage 1

To explain an advantage 1 of the embodiment, a comparative example will be discussed.

In the comparative example, a third driver 143-3 for controlling a first driver 142-3 is provided adjacent to the first driver 142-3 in the direction D2, as shown in FIG. 26. A fourth driver 143-4 for controlling a second driver 142-4 is provided adjacent to the second driver 142-4 in the direction D2, as shown in FIG. 26.

Figure 27:
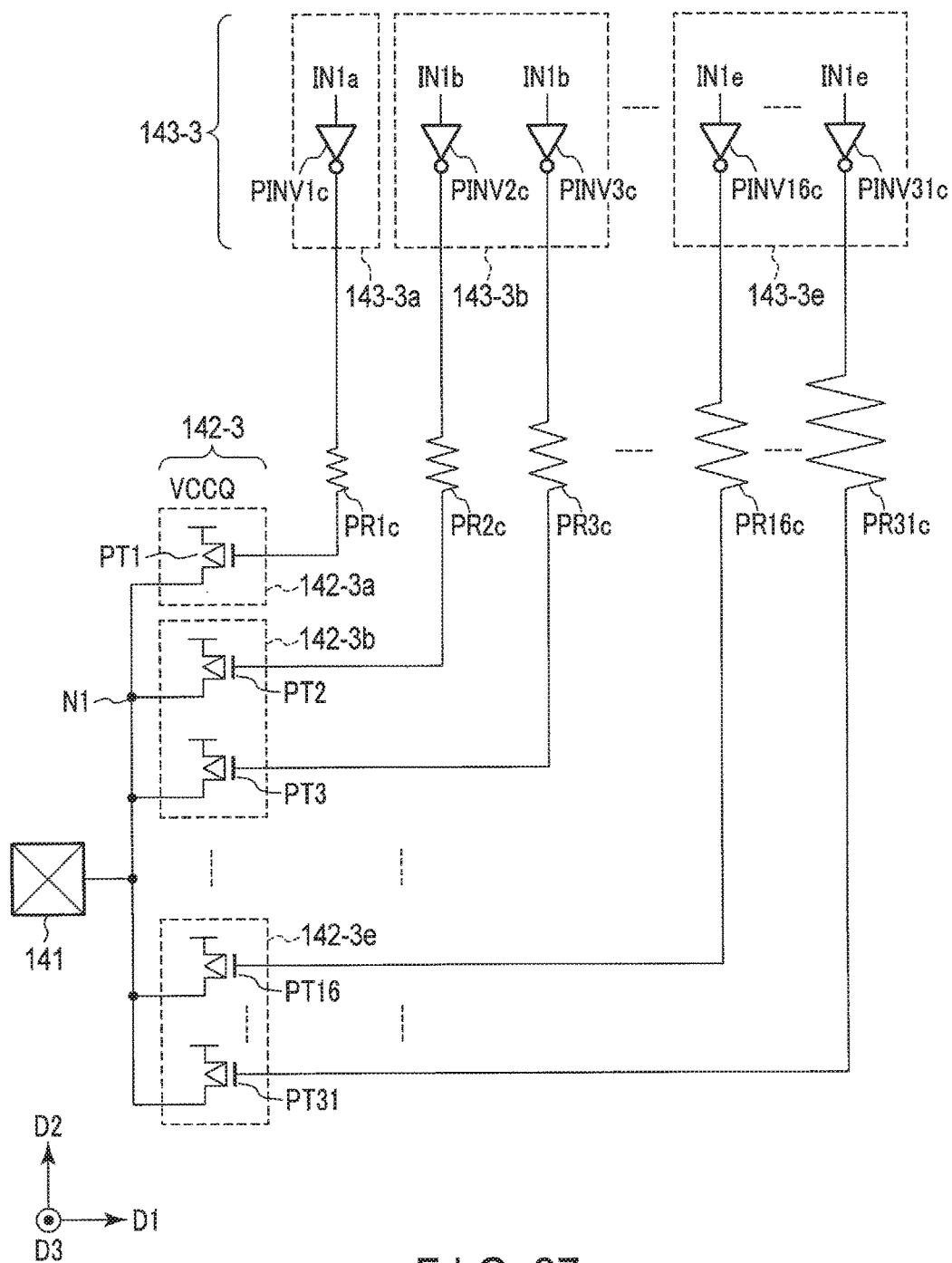
FIG. 27 is a circuit diagram illustrating the first and third drivers of a semiconductor memory device according to a comparative example of an embodiment.

By way of example, the relationship between the first driver 142-3 and the third driver 143-3 will be described. As shown in FIG. 27, inverters PINV (PINV1$c$ to PINV31$c$) of the third driver 143-3 (drivers 143-3$a$ to 143-3$e$) are respectively connected to PMOS transistors PT (PT1 to PT31) of the first driver 142-3 (drivers 142-3$a$ to 142-3$e$) by means of wiring lines extending along the direction D2. The wiring lines extending along the direction D2 are high-resistance wiring lines labeled, for example, as "MO." The wiring lines connecting the first driver 142-3 and the third driver 143-3 are longer than the wiring lines connecting the first drivers 142-1 and the third drivers 143-1 in the above-mentioned embodiment.

Figure 28:
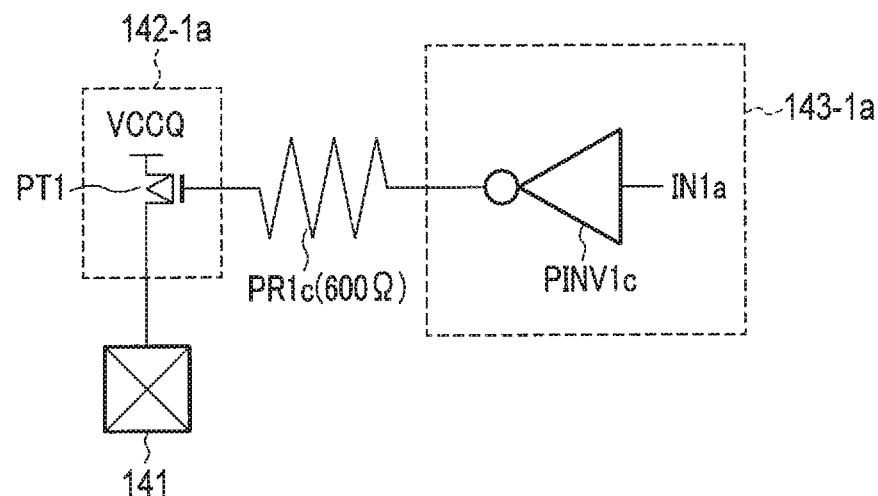
FIG. 28 is a diagram schematically illustrating the resistance value of a resistance element provided between an inverter and a PMOS transistor in a semiconductor memory device according to a comparative example of an embodiment.

As shown in FIG. 28, therefore, the resistance value of the resistor element PR1$c$ between the inverter PINV1$e$ and the PMOS transistor PT1 is, for example, 600Ω or so in the comparative example.

Figure 29:
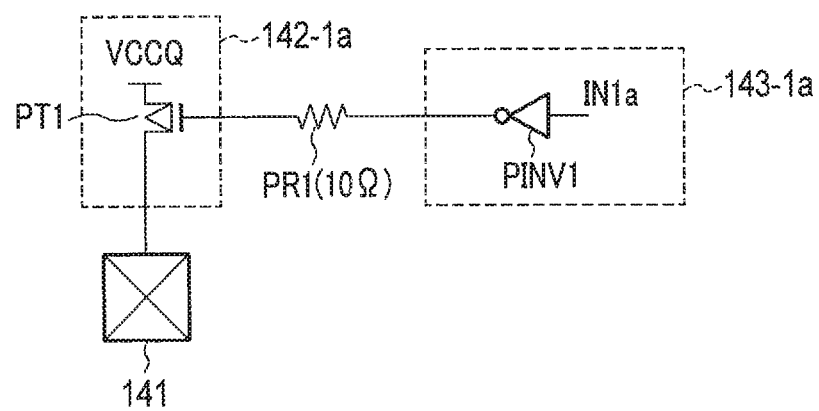
FIG. 29 is a diagram schematically illustrating the resistance value of a resistance element provided between an inverter and a PMOS transistor in a semiconductor memory device according to an embodiment.

On the other hand, as shown in FIG. 29, the resistance value of the resistor element PR1 between the inverter PINV1 and the PMOS transistor PT1 is, for example, 100 or so in the above mentioned embodiment.

Since the resistance value of the resistor element PR1$c$ is higher than that of the resistor element PR1, the circuit area of the inverter PINV1$c$ for controlling the PMOS transistor PT1 is larger than the circuit area of the inverter PINV1.

As can be seen from the above, as compared with the distance between the first driver 142-3 and the third driver 143-3 in the comparative example, the distance between the first driver 142-1 and the third driver 143-1 is short in the semiconductor memory device of the present embodiment. Therefore, the resistance value of the resistor element between the first driver 142-1 and the third driver 143-1 is smaller than the resistance value of the resistor element between the first driver 142-3 and the third driver 143-3. As a result, the circuit area of the inverter provided for the third driver 143-1 is smaller than the circuit area of the inverter provided for the third driver 143-3. As compared with the comparative example, in the above-mentioned embodiment, the circuit area of the semiconductor memory device can be smaller.

The same advantage realized for the relationship between the second driver 142-2 and the fourth driver 143-2 as well, although the related description is omitted herein.

<1-4-2> Advantage 2

In the comparative example, the distance between the inverter PINV1$c$ and the PMOS transistor PT1 is shorter than the distance between the inverter PINV2$c$ and the PMOS transistor PT2, as shown in FIG. 27. Therefore, the resistance value of the resistor element PR1$c$ between the inverter PINV1$c$ and the PMOS transistor PT1 is smaller than the resistance value of the resistor element PR2$c$ between the inverter PINV2$c$ and the PMOS transistor PT2.

Likewise, the respective distances between the inverters PINV2$c$ to PINV31$c$ and the PMOS transistors PT2 to PT31 are different from one another. Therefore, the resistance values of the resistor elements PR2$c$ to PR31$c$ increase in the order of the resistor elements PR2$c$ to PR31$c$.

Where the resistance values of the resistor elements PR1$c$ to PR31$c$ are different, since signals are supplied to the first driver 142-3 at different timings, the first driver 142-3 may unlikely generate proper output signals.

Figure 30:
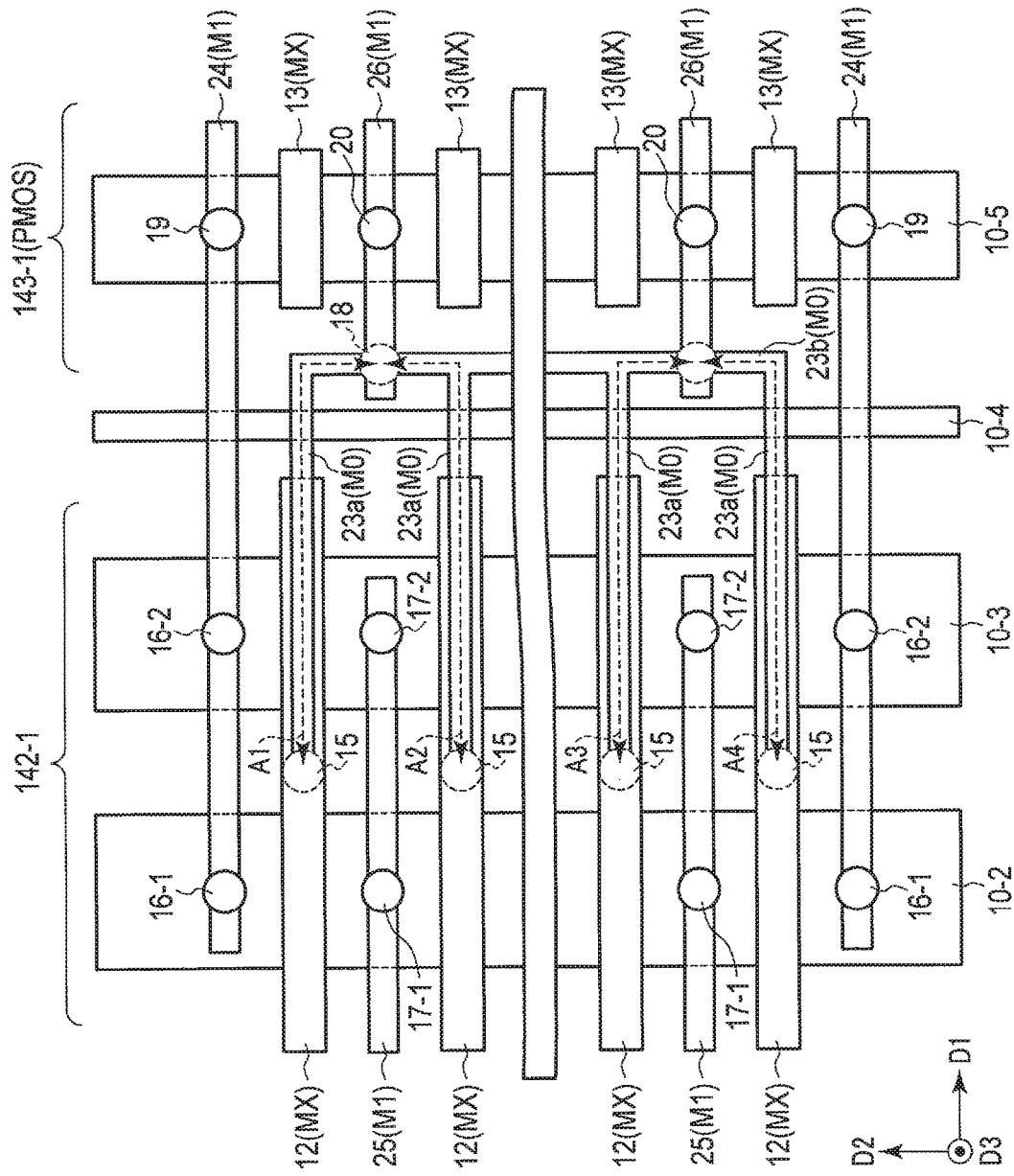
FIG. 30 is a diagram illustrating the layout of a plurality of PMOS transistors of driver 142-1 and the layout of a plurality of PMOS transistors of driver 143-1 in a semiconductor memory device according to an embodiment.

On the other hand, in the embodiment described above, the PMOS transistors of the driver 142-1 are located on a parallel with the PMOS transistors of the driver 143-1, as shown in FIG. 30. In addition, the distances A1 to A4 from the PMOS transistors of the driver 142-1 to the PMOS transistors of the driver 143-1 are substantially equal, as shown in FIG. 30. Thus, the resistance values of the resistor elements between the driver 142-1 and the driver 143-1 are substantially equal.

With this arrangement, the issue addressed in connection with the comparative example is eliminated.

The same advantage is realized for the second driver 142-2 and the fourth driver 143-2 as well, although the related description is omitted herein.

<1-4-3> Advantage 3

To explain advantage 3 of the embodiment, a comparative example will be mentioned.

As shown in FIG. 31, in the comparative example, a contact 15 is provided at a position close to a PMOS transistor PTb in the driver 142-3, and wiring lines 12 and 23$a$ are connected to the contact 15. In this case, the distance from the wiring line 23$a$ to the gate of the PMOS transistor PTb is B1, and the distance from the wiring line 23$a$ to the gate of a PMOS transistor PTa is B2 (B1<B2). With this arrangement, signals may be supplied to the PMOS transistors PTa and PTb at different timings, and consequently the PMOS transistors PTa and PTb may operate at different timings.

As shown in FIG. 32, in the present embodiment, a contact 15 is positioned between the PMOS transistor PTa and the PMOS transistor PTb of the driver 142-1, and the wiring lines 12 and 23$a$ are connected to the contact 15. With this arrangement, the distance from the wiring line 23$a$ to the gate of the PMOS transistor PTa and the distance from the wiring line 23$a$ to the gate of the PMOS transistor PTab are equal to each other (a distance B3). As a result, signals are supplied to the PMOS transistors PTa and PTb at approximately the same timing, and consequently the PMOS transistors PTa and PTb operate at approximately the same timing.

The same advantage is realized for the second driver 142-2 as well, although the related description is omitted herein.

<1-4-4> Advantage 4

As described above, in the present embodiment (FIG. 8 etc.), the voltage VCCQ is supplied in common to the driver 142-1 and the driver 143-1. Therefore, the cutoff characteristics of outputs with reference to internal noise are improved.

<1-4-5> Advantage 5

As described above, in the present embodiment (FIG. 18 etc.), the voltage VSS is supplied in common to the driver 142-2 and the driver 143-2. Therefore, the IR drop is mitigated.

<1-4-6> Advantage 6

To explain advantage 6 of the embodiment, a comparative example will be mentioned.

Figure 33:
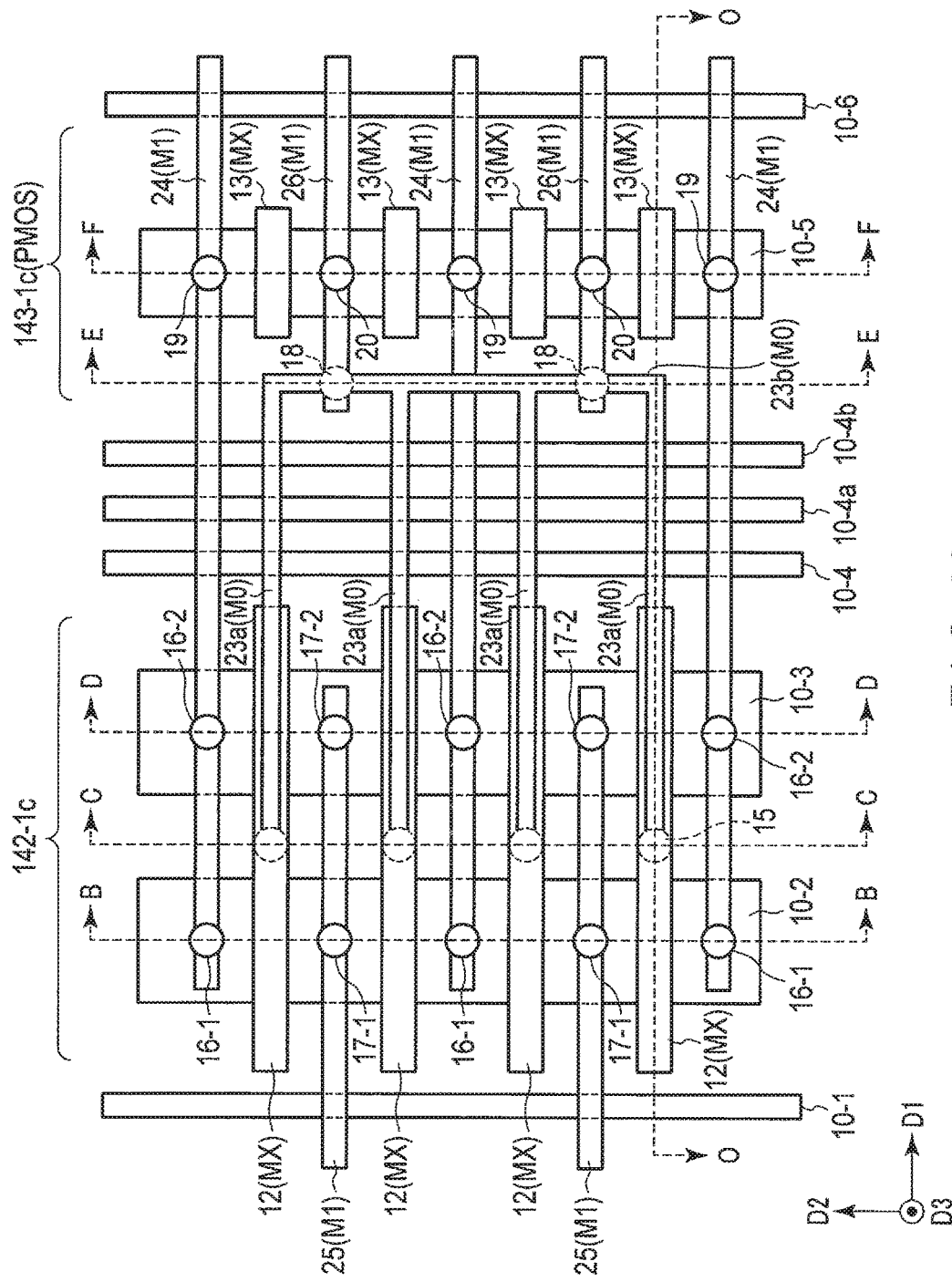
FIG. 33 is a diagram illustrating the layout of part of the first and third drivers in a semiconductor memory device according to a comparative example of an embodiment.

Transistors are protected by impurity regions used as a guard ring. The comparative example, as shown in FIGS. 33 and 34, presents a case where impurity regions 10-4$a$ and 10-4$b$ are further implemented to be used as a guard ring.

In the present embodiment, in contrast, the PMOS transistors of the driver 142-1 and the driver 143-1 are arranged close to each other, and impurity regions to be used as a guard ring are reduced to a necessary minimum. With this feature, in the present embodiment, the impurity regions 10-4a and 104-b are not necessary, and enlargement of the circuit area is prevented, accordingly.

<1-4-7> Advantage 7

Figure 35:
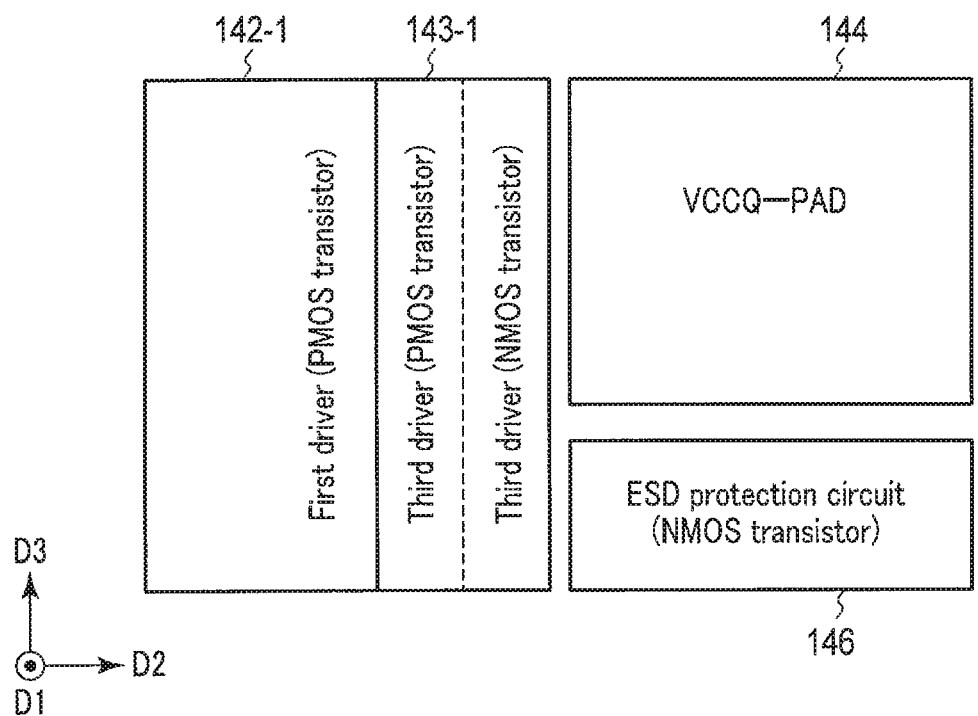
FIG. 35 is a diagram illustrating the layout of part of the input/output terminal in a semiconductor memory device according to an embodiment.

In the present embodiment, the NMOS transistor is provided at an end portion, as shown in FIG. 8. With this arrangement, an ESD protection circuit 146 formed of NMOS transistors can be arranged in the vicinity of the NMOS transistors NTa, as shown in FIG. 35. Therefore, the ESD protection circuit 146 is arranged without significantly increasing the circuit area.

2 Modification Example

The memory cell array 110 may have a configuration different from what was described above. A configuration of a memory cell array 110 is described, for example, in U.S. patent application Ser. No. 12/407,403 filed on Mar. 19, 2009 and entitled "THREE DIMENSIONAL STACKED NONVOLATILE SEMICONDUCTOR MEMORY." A similar configuration is also described in U.S. patent application Ser. No. 12/406,524 filed on Mar. 18, 2009 and entitled "THREE-DIMENSIONALLY STACKED NONVOLATILE SEMICONDUCTOR MEMORY", U.S. patent application Ser. No. 12/679,991 filed on Mar. 25, 2010 and entitled "NONVOLATILE SEMICONDUCTOR MEMORY DEVICE AND MANUFACTURING METHOD THEREOF", and U.S. patent application Ser. No. 12/532,030 filed on Mar. 23, 2009 and entitled "SEMICONDUCTOR MEMORY AND MANUFACTURING METHOD THEREOF." The entire contents of these applications are incorporated herein by reference.

What is claimed is:

1. A semiconductor memory device comprising:
   a memory cell array;
   a signal pad which supplies an output signal associated with the memory cell array;
   a first voltage pad which receives a first voltage;
   a first regulation circuit which regulates a signal output from the signal pad; and
   a first operation circuit which operates the first regulation circuit,
   wherein the first regulation circuit and the first operation circuit are provided between the signal pad and the first voltage pad.

2. The semiconductor memory device according to claim 1, wherein:
   the first regulation circuit comprises a plurality of first switches,
   the first operation circuit comprises a plurality of first inverters, and
   a plurality of first wiring lines are provided between the first switches and the first inverters, the respective first wiring lines being equal in length.

3. The semiconductor memory device according to claim 2, wherein the respective first wiring lines provided between the first switches and the first inverters have an equal resistance value.

4. The semiconductor memory device according to claim 2, wherein:
   the first inverters supply the first switches with second control signals that are inverted signals of first control signals, and
   the first switches supply a signal to the signal pad based upon the second control signals.

5. The semiconductor memory device according to claim 2, wherein:
   each of the first switches comprises a first transistor and a second transistor of a first conductive type, and
   the first transistor and the second transistor conduct the first voltage to the signal pad.

6. The semiconductor memory device according to claim 5, wherein:
   each of the first inverters comprises a third transistor of the first conductive type and a fourth transistor of a second conductive type,
   the first voltage is supplied to one end of the third transistor, the first wiring line is connected to the other end of the third transistor, and the first control signal is supplied to a gate of the third transistor, and
   the first voltage is supplied to one end of the fourth transistor, a second voltage is supplied to the other end of the fourth transistor, and the first control signal is supplied to a gate of the fourth transistor.

7. The semiconductor memory device according to claim 5, wherein:
   the first transistor and the second transistor share a gate extending along a first direction, and
   the first wiring line connects with the gates of the first transistor and the second transistor in an area between the first transistor and the second transistor.

8. The semiconductor memory device according to claim 6, wherein:
   the gates of the first, second, third and fourth transistors extend along a first direction, and
   active regions of the first, second, third and fourth transistors extend along a second direction that is perpendicular to the first direction.

9. The semiconductor memory device according to claim 8, wherein the gates of the first, second, third and fourth transistors lie in line.

10. The semiconductor memory device according to claim 1, further comprising:
    a second voltage pad which receives a second voltage different from the first voltage;
    a second regulation circuit which regulates a signal output from the signal pad; and
    a second operation circuit which operates the second regulation circuit,
    wherein the second regulation circuit and the second operation circuit are provided between the signal pad and the second voltage pad.

11. The semiconductor memory device according to claim 10, wherein:
    the second regulation circuit comprises a plurality of second switches,
    the second operation circuit comprises a plurality of second inverters, and
    a plurality of second wiring lines are provided between the second switches and the second inverters, the respective second wiring lines being equal in length.

12. The semiconductor memory device according to claim 11, wherein the respective second wiring lines provided between the second switches and the second inverters have an equal resistance value.

13. The semiconductor memory device according to claim 11, wherein:
    the second inverters supply the second switches with a fourth control signal that is an inverted signal of a third control signal via the second wiring lines, and the second switches supply the fourth control signal to the signal pad based upon the fourth control signal.

14. The semiconductor memory device according to claim 11, wherein:
    each of the second switches comprises a fifth transistor and a sixth transistor of a second conductive type, and
    the fifth transistor and the sixth transistor conduct the second voltage to the signal pad based upon a fourth control signal supplied by the second inverter.

15. The semiconductor memory device according to claim 14, wherein:
    each of the second inverters comprises a seventh transistor of a first conductive type and a eighth transistor of the second conductive type,
    the first voltage is supplied to one end of the seventh transistor, the second wiring line is connected to the other end of the seventh transistor, and the third control signal is supplied to a gate of the seventh transistor, and
    the second wiring line is connected to one end of the eighth transistor, the second voltage is supplied to the other end of the eighth transistor, and the third control signal is supplied to a gate of the eighth transistor.

16. The semiconductor memory device according to claim 14, wherein:
    the fifth transistor and the sixth transistor share a gate extending along a first direction, and
    the second wiring line connects with the gate of the fifth transistor and the sixth transistor in an area between the fifth transistor and the sixth transistor.

17. The semiconductor memory device according to claim 15, wherein:
    the gates of the fifth, sixth, seventh and eighth transistors extend along a first direction, and
    active regions of the fifth, sixth, seventh and eighth transistors extend along a second direction that is perpendicular to the first direction.

18. The semiconductor memory device according to claim 17, wherein the gates of the fifth, sixth, seventh and eighth transistors lie in line.

* * * * *